United States Patent
Ukita et al.

(10) Patent No.: US 6,694,614 B2
(45) Date of Patent: Feb. 24, 2004

(54) LASER PROCESSING METHOD AND EQUIPMENT FOR PRINTED CIRCUIT BOARD

(75) Inventors: Katsuichi Ukita, Osaka (JP); Kazuhide Isaji, Osaka (JP); Hideaki Nagatoshi, Osaka (JP); Hidehiko Karasaki, Hyogo (JP); Hisashi Kinoshita, Osaka (JP); Tsutomu Yano, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/867,621

(22) Filed: May 31, 2001

(65) Prior Publication Data

US 2002/0008093 A1 Jan. 24, 2002

(30) Foreign Application Priority Data

Jun. 2, 2000 (JP) .......................... 2000-165991

(51) Int. Cl.⁷ .......................... H01R 43/00; B23K 26/00
(52) U.S. Cl. .......................... 29/852; 29/825; 219/121.6; 219/121.7; 219/121.71; 438/57
(58) Field of Search .......................... 29/825, 852, 830; 219/121.71, 121.6, 121.69, 121.67, 121.68, 121.7; 438/57, 98

(56) References Cited

U.S. PATENT DOCUMENTS

| | | | | |
|---|---|---|---|---|
| 4,328,410 A | * | 5/1982 | Slivinsky et al. |
| 4,412,743 A | * | 11/1983 | Eberly |
| 4,519,064 A | * | 5/1985 | Takagi et al. |
| 4,865,448 A | * | 9/1989 | Akutsu et al. |
| 5,310,986 A | * | 5/1994 | Zumoto et al. |
| 5,317,141 A | * | 5/1994 | Thomas |
| 5,726,443 A | * | 3/1998 | Immega et al. |
| 6,040,552 A | * | 3/2000 | Jain et al. |
| 6,168,910 B1 | * | 1/2001 | Hino et al. |
| 6,177,681 B1 | * | 1/2001 | Nakamura |
| 6,228,466 B1 | * | 5/2001 | Tsukada et al. |

FOREIGN PATENT DOCUMENTS

EP   0 980 737 A1   2/2000

OTHER PUBLICATIONS

Patent Abstracts of Japan vol. 014, No. 291 (M–0989), Jun. 22 1990 & JP 02 092482 A (Hitachi LTD), Apr. 3, 1990.
Patent Abstracts of Japan vol. 1999, No. 08, Jun. 30, 1999 & JP 11 077355 A (Matsushita Electric Ind Co. LTD), Mar. 23, 1999.

* cited by examiner

*Primary Examiner*—Ljiljana Ciric
(74) *Attorney, Agent, or Firm*—Wenderoth, Lind & Ponack, L.L.P.

(57) ABSTRACT

A laser processes a circuit board including at least two layers. The two layers are a conductive layer with a plurality of holes and an insulating layer. The conductive layer is disposed on a surface layer of the insulating layer which is to be processed by applying a laser beam to portions of the insulating layer corresponding to the holes of the conductive layer. The circuit board is irradiated with the laser beam, and a reflected laser beam is detected, whereby the laser processing of the insulating layer corresponding to an abnormal hole in the conductive layer is stopped, if the detected value of the reflected laser beam is an abnormal value differing from a desired value. Also, the insulating layer corresponding to the hole is processed when the detected value of the reflected light conforms to the desired value.

32 Claims, 23 Drawing Sheets

LASER PROCESSING METHOD AND EQUIPMENT FOR PRINTED CIRCUIT BOARD

FIELD OF THE INVENTION

The present invention relates to laser processing of a printed circuit board, and more particularly to a laser processing method and a laser processing apparatus suitable for forming holes in a multi-layer printed circuit board having an insulating layer and a conductive layer laminated in multiple layers.

BACKGROUND OF THE INVENTION

Generally, a multi-layer circuit board is formed by laminating an insulating layer and a conductive layer alternately. Most electronic circuits have come to use widely such multi-layer printed circuit boards which are effective for increasing the mounting density of circuit parts.

Specifically, holes are formed in an insulating layer of a multi-layer printed circuit board, and the holes are filled with solder or conductive paste, which connect adjacent conductive layers in the multi-layer printed circuit board.

Thus, the conventional laser processing apparatus makes holes in the insulating layer by employing laser beam processing technology.

In the laser processing apparatus, laser beams of long wavelength are often used. This is because laser beams of long wavelength are suitable to be absorbed in the insulating layer and easily reflected on the conductive layer. For example, when the insulating layer is a glass epoxy resin with glass fibers in it, and the conductive layer is a copper foil, the processing apparatus selectively removes only the insulating layer by using a carbon dioxide($CO_2$) laser beam.

When the laser beam opens holes in the resin part exposed in holes of the copper foil of the printed circuit board, the holes of the copper foil of the surface layer are often deviated from the standard positions of holes or the holes of the copper foil are sometimes abnormal in shape and size.

The conventional laser processing apparatus has continued to process the printed circuit board up to the final step, even if there was position deviation of copper foil holes, abnormal hole diameter and hole shape. In such a case, a printed circuit board having small electronic parts mounted on it was not dimensionally correct, so that the printed circuit board did not operate normally and was then scrapped as a defective piece. In the conventional laser processing apparatus, products are checked in the final stage, and defective pieces are sorted out during the final stage. In another case, the conventional laser processing apparatus utilizes an image recognition process or the like, so as to check the hole position, hole diameter and hole shape of the copper foil of the surface layer, before making a hole in the resin part by laser.

Such prior art has the following problems. In the conventional laser processing apparatus, since the printed circuit boards are checked in the final stage, printed circuit boards must be processed completely up to the final stage, even if they have such defects as abnormality in hole position, hole diameter or hole shape of the copper foil and are not usable. As a result, wasteful processing, time, material and energy are spent, and the total manufacturing cost is raised in the conventional process.

In a case of adding a conventional process for checking the hole position, size and shape with an image recognition device before making holes in the resin part by laser processing, such a prior step must be added, and the manufacturing time and cost are increased by this step.

SUMMARY OF THE INVENTION

It is, hence, an object of the invention to present a method and apparatus for solving these conventional problems. The invention presents a method and an apparatus for making holes in the resin layer while inspecting the hole position, hole diameter and hole shape of the copper foil of the surface layer, hole by hole, using the laser beam, instead of merely making holes in the resin layer of the printed circuit board.

To solve the problems, the invention presents a laser processing method and apparatus for processing a circuit board including at least two layers, having a conductive layer with a plurality of holes disposed on a surface layer of an insulating layer to be processed by applying a laser beam to an insulating layer corresponding to holes of the conductive layer. In this laser processing method and apparatus, a circuit board is irradiated with a laser beam, and a reflected laser beam is detected, whereby the laser process of the insulating layer corresponding to an abnormal hole in the conductive layer is stopped, if the detected value of the reflected laser beam is an abnormal value outside of a desired value. Also in this laser processing method and apparatus, the insulating layer corresponding to the hole is processed when the detected value of the reflected laser beam conforms to the desired value.

DESCRIPTION OF THE PREFERRED EMBODIMENTS

Figure 1:
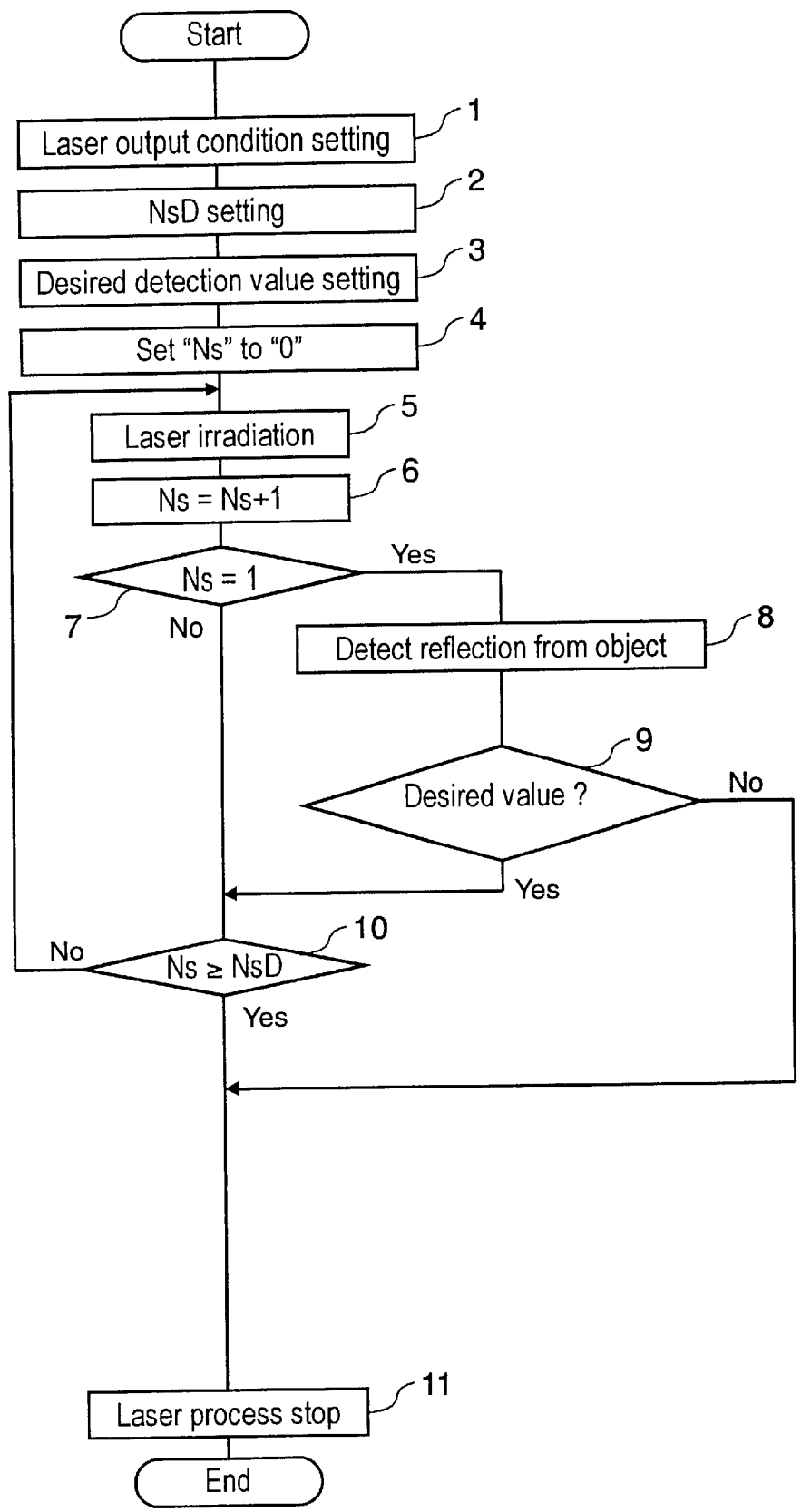
FIG. 1 is a schematic diagram of a laser processing method showing an embodiment of the invention.

FIG. 1 is a schematic diagram of a laser processing method showing an embodiment of the invention.

The laser processing apparatus of the invention starts operation and proceeds in the following steps: laser beam output condition setting step 1, desired laser irradiation or process count NsD setting step 2, desired reflection value setting step 3, initializing step 4 of resetting the irradiation or process count Ns to 0, and laser bean irradiation step 5.

The laser processing apparatus, prior to the start of laser processing, sets the output condition of laser according to the object to be processed at laser output condition setting step 1. Consequently, the laser irradiation setting step 2 sets the desired laser irradiation or process count NsD. The setting of the irradiation or process count is preliminarily determined depending on the material of the insulating layer, processing precision, and finishing quality target of such object to be processed as a printed circuit board. The detection value setting step 3 sets the criterion of a desired detection value of reflected laser beam when the hole position, hole size and hole shape of the conductive layer of the printed circuit board are normal (i.e., the hole is normal). The initializing step 4 resets the laser irradiation or process count Ns to 0.

At laser processing step 5, the laser processing apparatus processes the printed circuit board. Further, the laser processing apparatus proceeds, through process count up step 6, to process count judging step 7. The process count up step 6 counts up the process count Ns by one, i.e. Ns=Ns+1, every time the laser processing apparatus irradiates the laser beam to one hole. Next, the process count judging step 7 judges if the laser irradiation is the first time or not. In the case of the first irradiation, that is, when the process count Ns is 1 (Ns=1), the laser processing apparatus detects the reflected laser beam from the object to be processed at reflection detecting step 8, and goes to desired detection value judging step 9.

On the other hand, when the laser irradiation or process count Ns is not the first time (Ns>1), the laser processing apparatus goes to irradiation judging step 10, which judges if the laser irradiation or process count Ns has reached the desired laser irradiation or process count NsD or not.

Consequently, at the desired detection value judging step 9, when the reflected laser beam from the object to be processed is within a desired detection value, the laser processing apparatus goes to the laser irradiation judging step 10, which judges if the laser irradiation or process count Ns has reached the set value or not. If, at the desired detection value judging step 9, the reflected light from the object to be processed is not the desired a detection value, that is, if the detection value is an abnormal value, the laser processing apparatus goes to laser process stopping step 11, and immediately stops the laser processing. As a result, in the case of such abnormality, the laser processing apparatus immediately stops the laser processing operation, so that the subsequent wasteful processing is omitted.

At the laser irradiation judging step 10, if the laser irradiation or process count Ns has not reached the set value NsD (Ns<NsD), the laser processing apparatus returns to the laser irradiation step 5, and repeats the subsequent steps. When the laser irradiation or process count Ns has reached the desired set value NsD (Ns≧NsD) at laser irradiation judging step 10, the laser processing apparatus goes to the laser process stopping step 11, and immediately stops the laser processing. Thus, processing of one hole is finished.

According to the laser processing apparatus and processing method in the embodiment shown in FIG. 1, a printed circuit board including at least two layers which are a conductive layer (for example, a copper foil) and an insulating layer (for example, a resin), and which are adjacent to each other and differing in chemical composition from each other is processed. The object to be processed is the resin of the insulating layer which is exposed at a plurality of holes opened in the surface layer of the conductive layer and which is irradiated with the laser beam. Upon irradiating the laser beam, first, the laser processing apparatus detects the reflected laser beam from the surface of the printed circuit board and stops laser processing immediately if the detection is out of (differs from) the desired set value. Thus, the laser processing apparatus inspects the printed circuit board first, then processes, so that the apparatus, therefore, can find a deviation of hole position or abnormality in hole size or hole shape of the copper foil just before processing. In other words, according to the laser processing apparatus and processing method in the embodiment shown in FIG. 1, by applying the laser beam, the apparatus processes a printed circuit board having at least two layers which are a conductive layer (for example, a copper foil) and an insulating layer (for example, a resin), and which are adjacent to each other and different in chemical composition from each other. Upon detecting the reflected laser beam from the surface of the printed circuit board, when an abnormal value is detected, the laser processing apparatus stops laser processing immediately without starting the processing of the insulating layer, and when a normal desired value is detected, the laser processing apparatus starts the processing of the insulating layer.

Thus, by processing while inspecting, an abnormality of the object to be processed can be detected just before starting the process without requiring any extra step for inspection.

Figure 2:
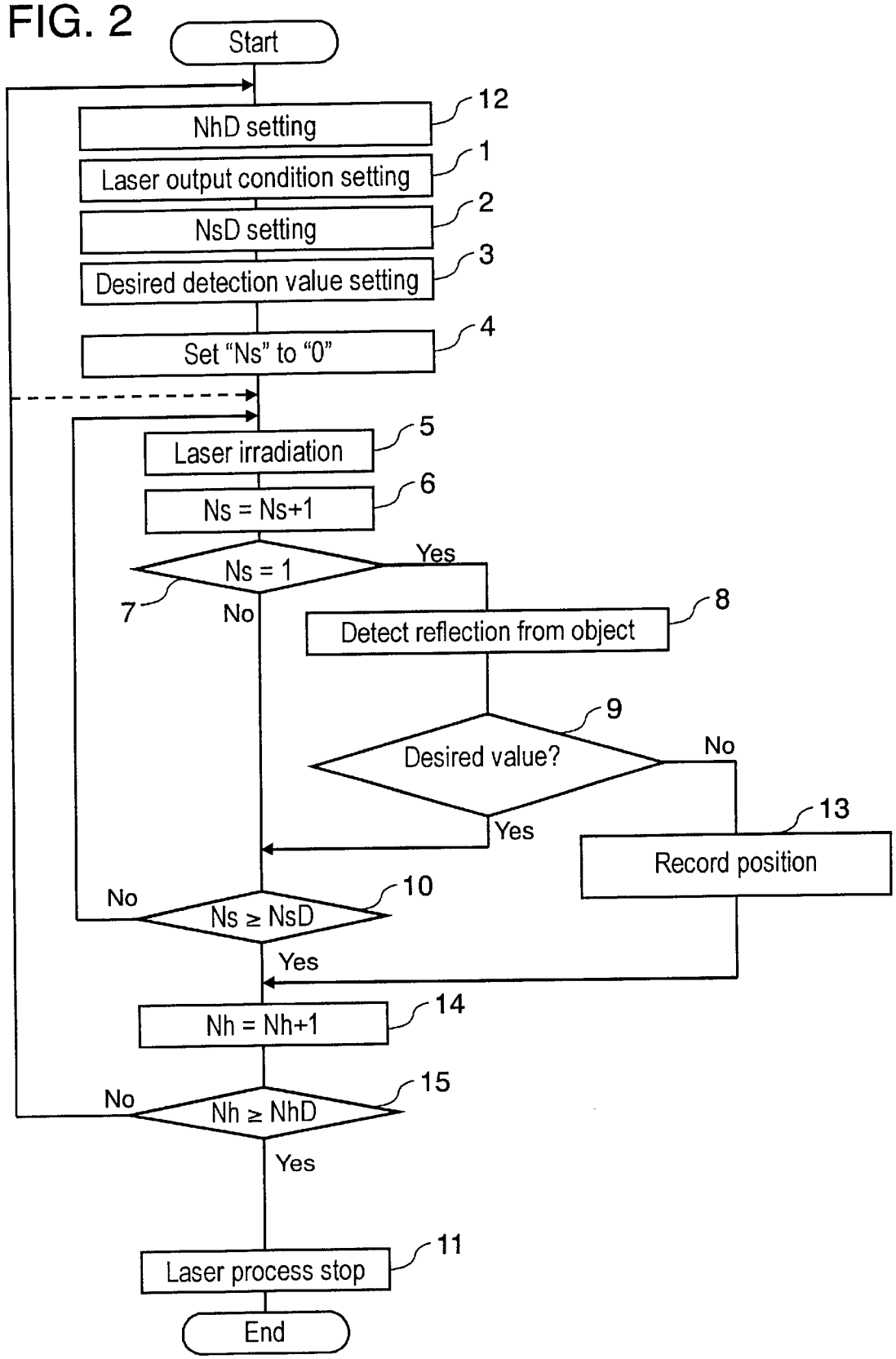
FIG. 2 is a schematic diagram of a laser processing method showing another embodiment of the invention.

FIG. 2 is a schematic diagram of a laser processing method showing another embodiment of the invention. In FIG. 2, to avoid duplication of description, only the parts different from those in FIG. 1 are explained herein. The substantial difference in FIG. 2 from the embodiment in FIG. 1 is that the information about abnormal hole position is recorded if an abnormal value of reflected laser beam is detected.

In FIG. 2, upon start, the laser processing apparatus of the embodiment first sets the number of holes NhD to be made in the printed circuit board at hole number setting step 12. Since the subsequent steps 1 to 11 are same as in FIG. 1, they are not explained herein.

At the laser irradiation judging step 10, when the laser irradiation or process count Ns has reached the desired set value NsD (Ns≧NsD), the laser processing apparatus goes to hole number count up step 14. The hole number count up step 14 counts up the hole number Nh by adding 1 to Nh (Nh=Nh+1), and the process goes to hole number judging step 15. The hole number judging step 15 judges if the hole number Nh has reached the desired value NhD or not. Upon reaching the desired number NhD (Nh≧NhD), the process goes to laser process stop step 11, so that the laser processing is finished. On the other hand, the hole number judging step 15 judges if the hole number Nh has reached the desired value NhD or not. Before reaching the desired number NhD (Nh<NhD), the process returns to the beginning, that is, the hole number setting step 12, or the laser beam irradiation step 5. Then the process repeats the subsequent steps until the hole number Nh reaches the desired number NhD (Nh≧NhD). Thus, processing of specified number of holes NhD is completed.

At desired detection value judging step 9 of FIG. 2, if the reflected laser beam from the object to be processed is not within a desired value, that is, if the value of the reflected laser beam is abnormal, the laser processing apparatus goes to position recording step 13. After the position recording step 13 records the abnormal hole position of the object to be processed, the laser processing apparatus goes to hole number count up step 14, and then goes to process of next hole. In this case, the hole number is counted up whether abnormal value of reflected laser beam is detected or not in the each laser processing. By repeating this operation for the specified number of holes, the laser processing apparatus records the information about positions of all abnormal holes in which detection values are abnormal, and processes all holes of normal detected values. When processing of all normal holes is finished, the laser processing operation is terminated.

By detecting the reflected laser beam by the first laser irradiation in laser processing, if there is abnormality in position, diameter or shape of hole of the copper foil, abnormality can be judged without requiring another inspection process. Moreover, as the data of all hole positions of abnormal hole is recorded, so the recorded data can be utilized in re-inspection after processing, re-processing and a subsequent step, or utilized in fine adjustment or re-setting of conditions at the laser output condition setting step 1.

Moreover, since laser processing is done while inspecting, an abnormality of the object to be processed can be detected just before processing without requiring any extra step for inspection.

In all embodiments of laser processing shown in FIG. 2 and in the following drawings, either the laser may be applied to one hole continuously or in pulse train, or the laser may be applied hole by hole sequentially to plural holes existing in a certain working area. In either case, the laser processing apparatus obtains the same effects as described above.

Figure 3:
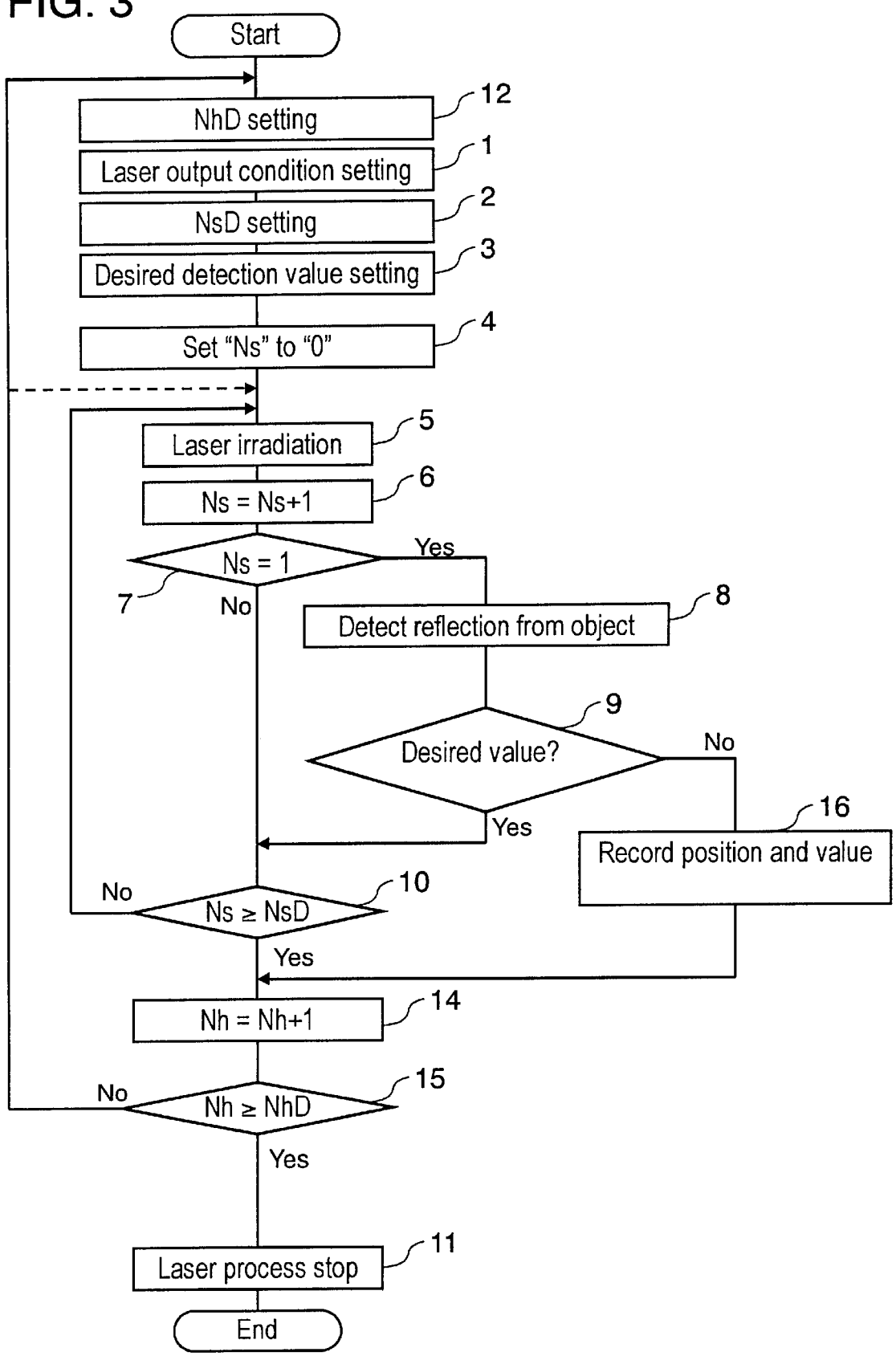
FIG. 3 is a schematic diagram of a laser processing method showing a different embodiment of the invention.

FIG. 3 is a schematic diagram of a laser processing method showing a different embodiment of the invention. In FIG. 3, to avoid duplication of description, only the parts different from those in FIG. 2 are explained herein. In the embodiment of FIG. 3, in addition to the embodiment of FIG. 2, the laser processing apparatus stops laser processing of the insulating layer corresponding to an abnormal hole in the conductive layer when the detection of the reflected laser beam is an abnormal value that is outside of the desired value, and further records the information about the abnormal value of the abnormal hole.

In FIG. 3, the laser processing apparatus of the embodiment judges the reflected laser beam from the object to be processed at the desired value detection step 9. If it is out of the desired value, that is, an abnormal value, the process goes to abnormal position and value recording step 16. After recording the position, diameter and shape of abnormal hole of the object to be processed at the abnormal position and value recording step 16, the laser processing apparatus goes to hole number count up step 14, and then starts processing the next hole.

In this case, in addition to the effect of the embodiment of FIG. 2, aside from recording of all abnormal hole positions out of the desired detection value, the laser processing apparatus inspects the abnormality at a processing point. Further, since the numerical values of diameter and shape of abnormal hole are recorded, they can be useful in fine adjustment, in re-adjusting for more accurate conditions, in re-inspection, in post-processing, in re-processing, in a subsequent step, or in adjusting the laser output condition.

Figure 4:
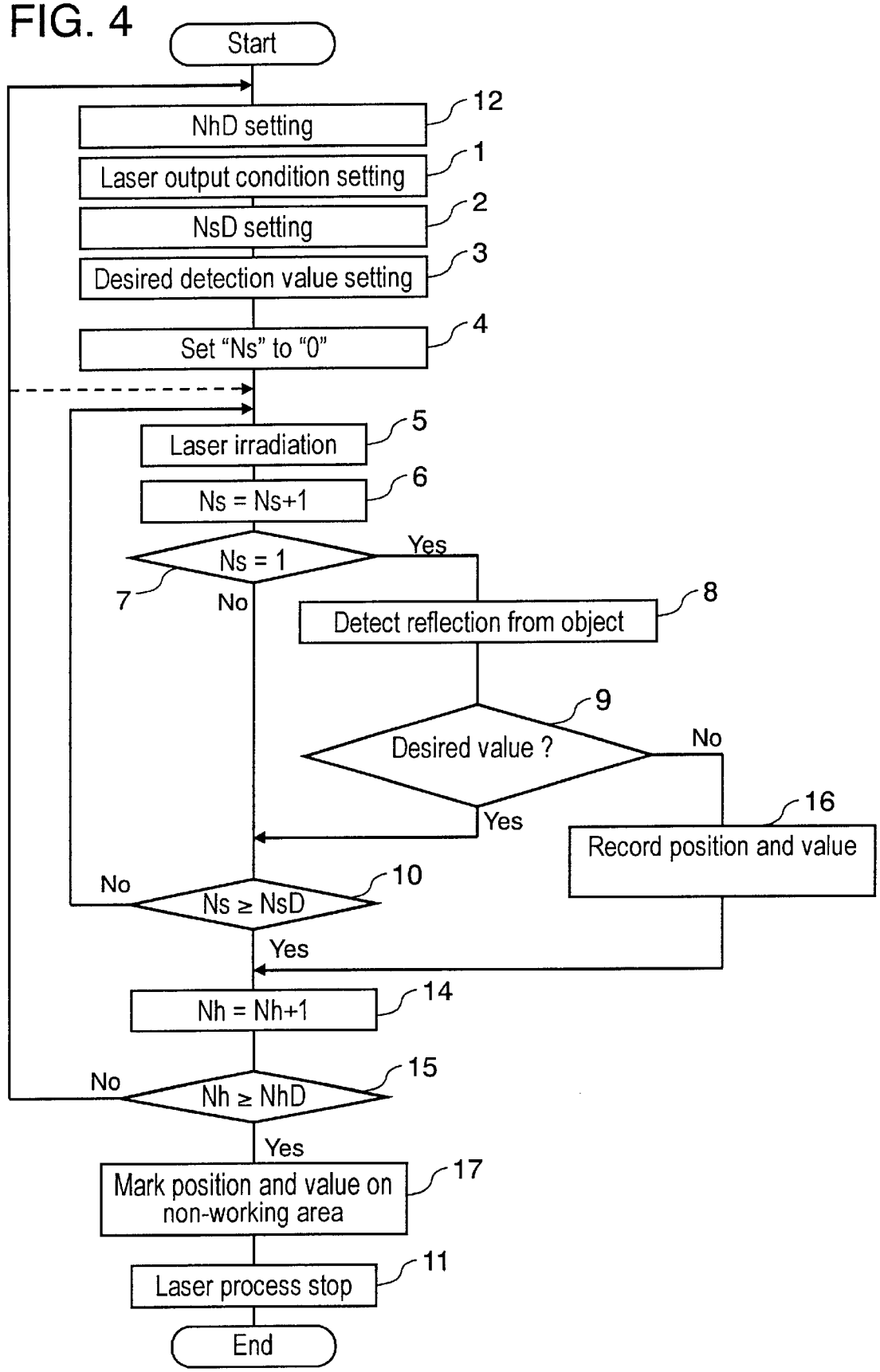
FIG. 4 is a schematic diagram of a laser processing method showing a further different embodiment of the invention.

FIG. 4 is a schematic diagram of a laser processing method showing a further different embodiment of the invention. In FIG. 4, to avoid duplication of description, only the parts different from those in FIG. 3 are explained herein. In the laser processing method of FIG. 4, in addition to the method of FIG. 3, the information about positions of abnormal holes and abnormal values is marked in a non-working area of the circuit board.

In FIG. 4, at hole number judging step 15, when the hole number Nh has reached the desired value NhD (Nh≧NhD), the laser processing apparatus of the embodiment goes to laser marking step 17. The laser marking step 17 marks the necessary information from among the position, diameter, and shape of abnormal holes by laser beam as character data or symbols in the non-working area of the printed circuit board, based on the data recorded in the position and value recording step 16.

After the marking at the laser marking step 17 is complete, the laser processing apparatus goes to laser process stopping step 11 to finish the processing.

Thus, according to the embodiment of FIG. 4, in addition to the benefits explained in the embodiments in FIG. 1 to FIG. 3, an operator can visually recognize the abnormal hole by the character or symbol marked on the multi-layer printed circuit board. Therefore, the operator can easily re-inspect or re-process the multi-layer printed circuit board. It is further advantageous that the operator not only can inspect the deviation of hole position, or abnormality of hole diameter or hole shape easily, but also can finely adjust and re-enter the accurate conditions by referring to the character or symbol data.

Figure 5:
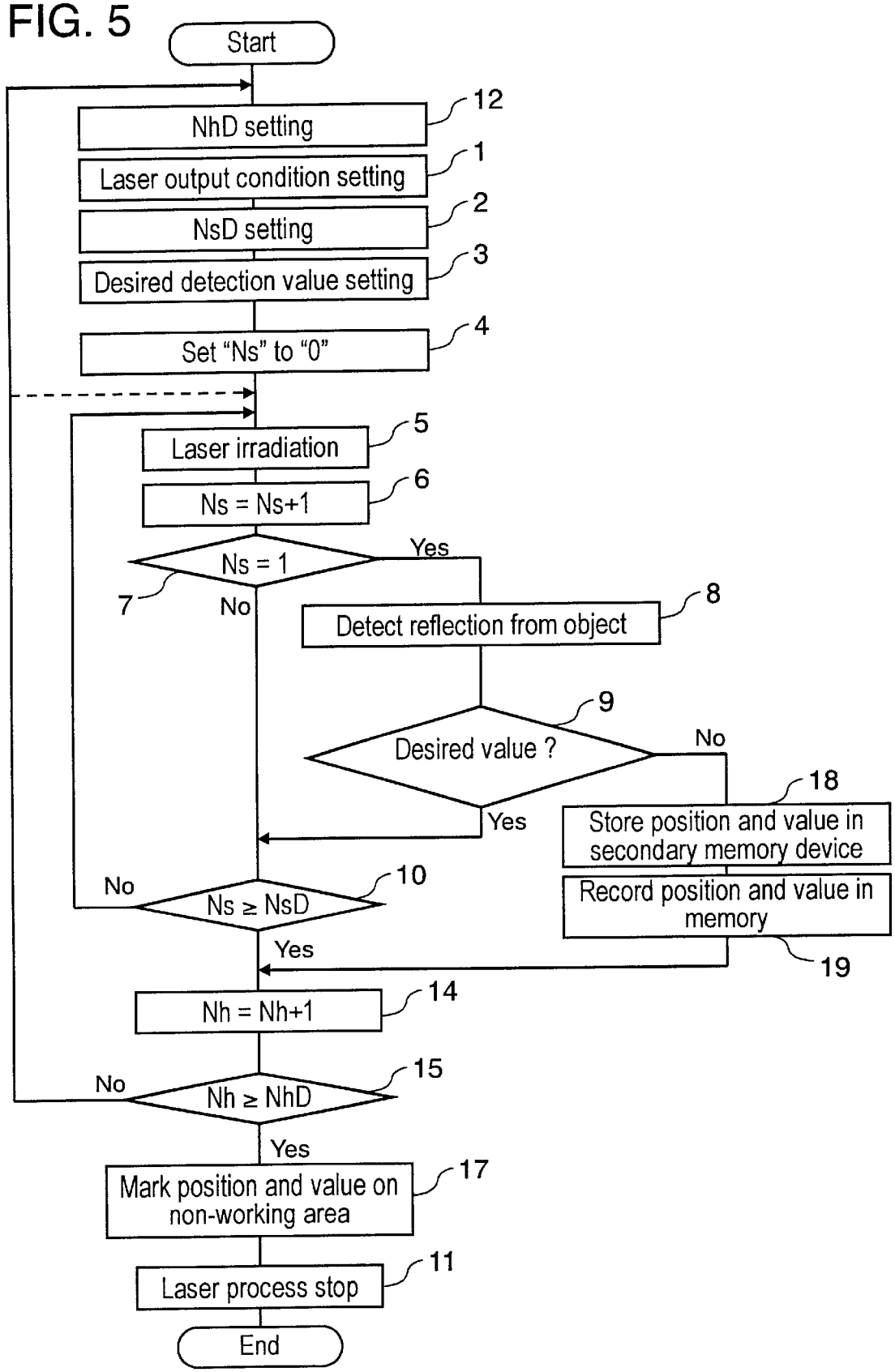
FIG. 5 is a schematic diagram of a laser processing method showing a further different embodiment of the invention.

FIG. 5 is a schematic diagram of a laser processing method showing a further different embodiment of the invention. In FIG. 5, to avoid duplication of description, only the parts different from those in FIG. 4 are explained herein.

In FIG. 5, the laser processing apparatus judges the reflected laser beam from the object to be processed at the desired value detection step 9. If the reflected laser beam from the object to be processed is outside of the desired value, that is, an abnormal value, the apparatus goes to position and value storing step 18. The position and value storing step 18 stores the information about position and abnormal value in a secondary storage device such as a hard disk drive. After storing the values, positions, diameters and shapes of abnormal holes in the secondary storage device such as a hard disk drive, the laser processing apparatus goes to recording step 19. The recording step 19 converts the information about position, diameter and shape of abnormal holes into data of characters, numerals and symbols, which are easily marked on the surface of the printed circuit board and records the information in memory. After the recording step 19, the laser processing apparatus goes to hole number count up step 14, and then starts to process next hole.

In this case, same as in FIG. 4, in addition to the benefits explained in embodiments in FIG. 1 to FIG. 4, any operator can visually recognize the character, numeral or symbol data marked on multi-layer printed circuit board, and therefore the operator can easily re-inspect or re-process the multi-layer printed circuit board. It is also advantageous that the data stored in the storing means such as a hard disk drive cannot only be utilized in marking the abnormal positions on the multi-layer printed circuit board, but also can be used in post-process analysis and in quality control in cooperation with a computer system. It is further advantageous that at condition setting step 1 of the laser processing apparatus, the operator of the apparatus can adjust and re-enter accurate conditions more finely, while referring to the character data.

Figure 6:
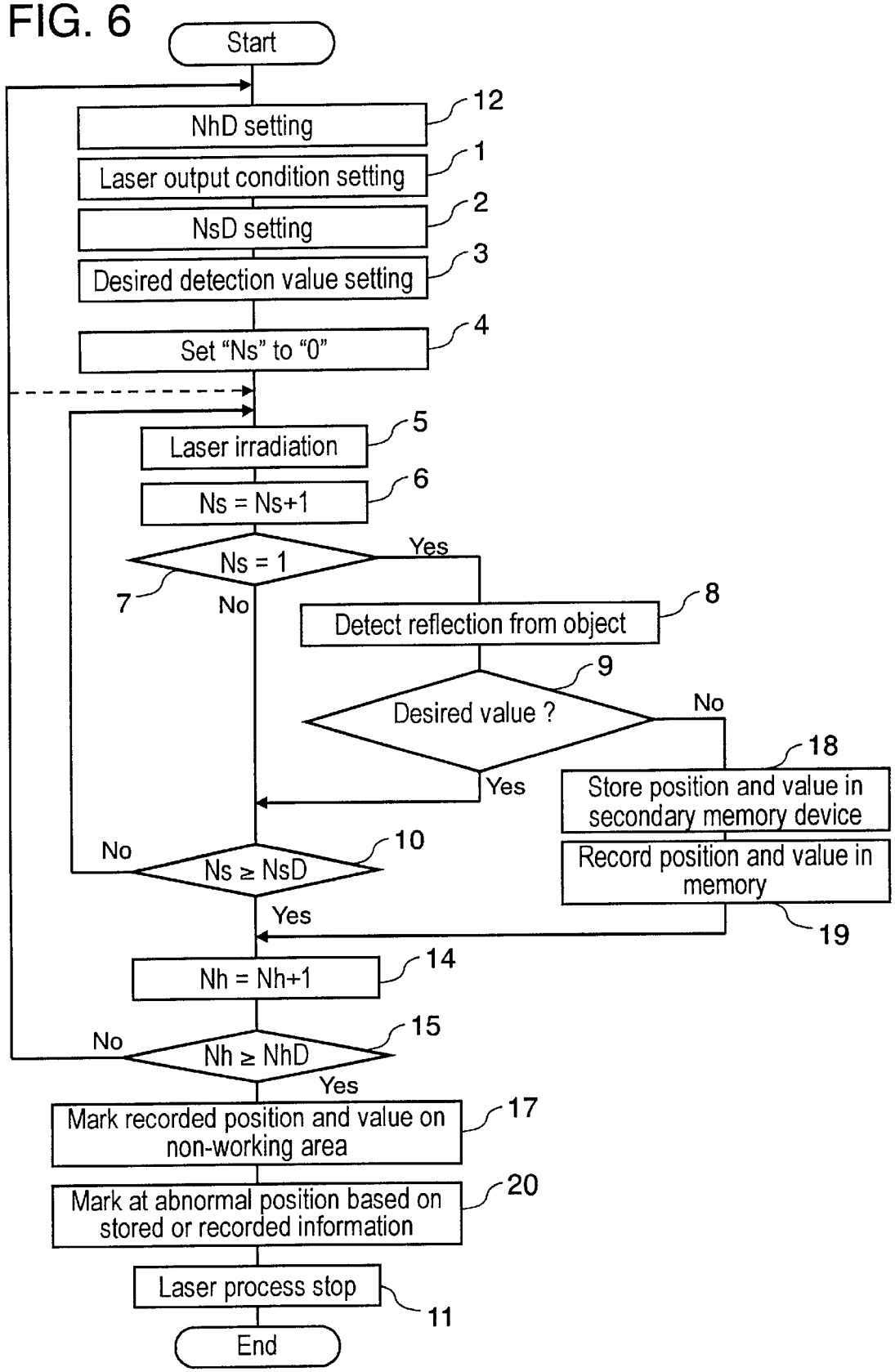
FIG. 6 is a schematic diagram of a laser processing method showing a further different embodiment of the invention.

FIG. 6 is a schematic diagram of a laser processing method showing a further different embodiment of the invention. In FIG. 6, to avoid duplication of description, only the parts different from those in FIG. 5 are explained herein. In the embodiment of FIG. 6, in addition to the effect of FIG. 5, the necessary information about abnormal holes is marked in a non-working area near the corresponding abnormal holes.

In FIG. 6, after marking data in character, numeral or symbol form on the non-working area of circuit board at laser marking step 17, the laser processing apparatus goes to abnormal position marking step 20. The abnormal position marking step 20 marks by laser beam at the abnormal position of the multi-layer printed circuit board, based on the information stored in the secondary storage device, such as a hard disk drive, during storing step 18, as well as based on the data converted and recorded at the recording step 19. Those marks are, for example, circular marks surrounding the processed holes, dots or circles near the processed holes, or characters. Afterwards, the laser processing apparatus terminates the process at laser process stopping step 11.

Thus, according to the embodiment shown in FIG. 6, in addition to marking the data with characters as discussed in the embodiments of FIG. 4 or FIG. 5, it is advantageous that since positions of abnormal processed holes are indicated by marks, the operator can re-inspect or re-process smoothly without mistakes, while observing the abnormal positions.

In the foregoing embodiments, abnormal data and abnormal positions are marked by laser beam, but the same effects can be obtained by marking with a stamp, ink or other marking means.

Figure 7:
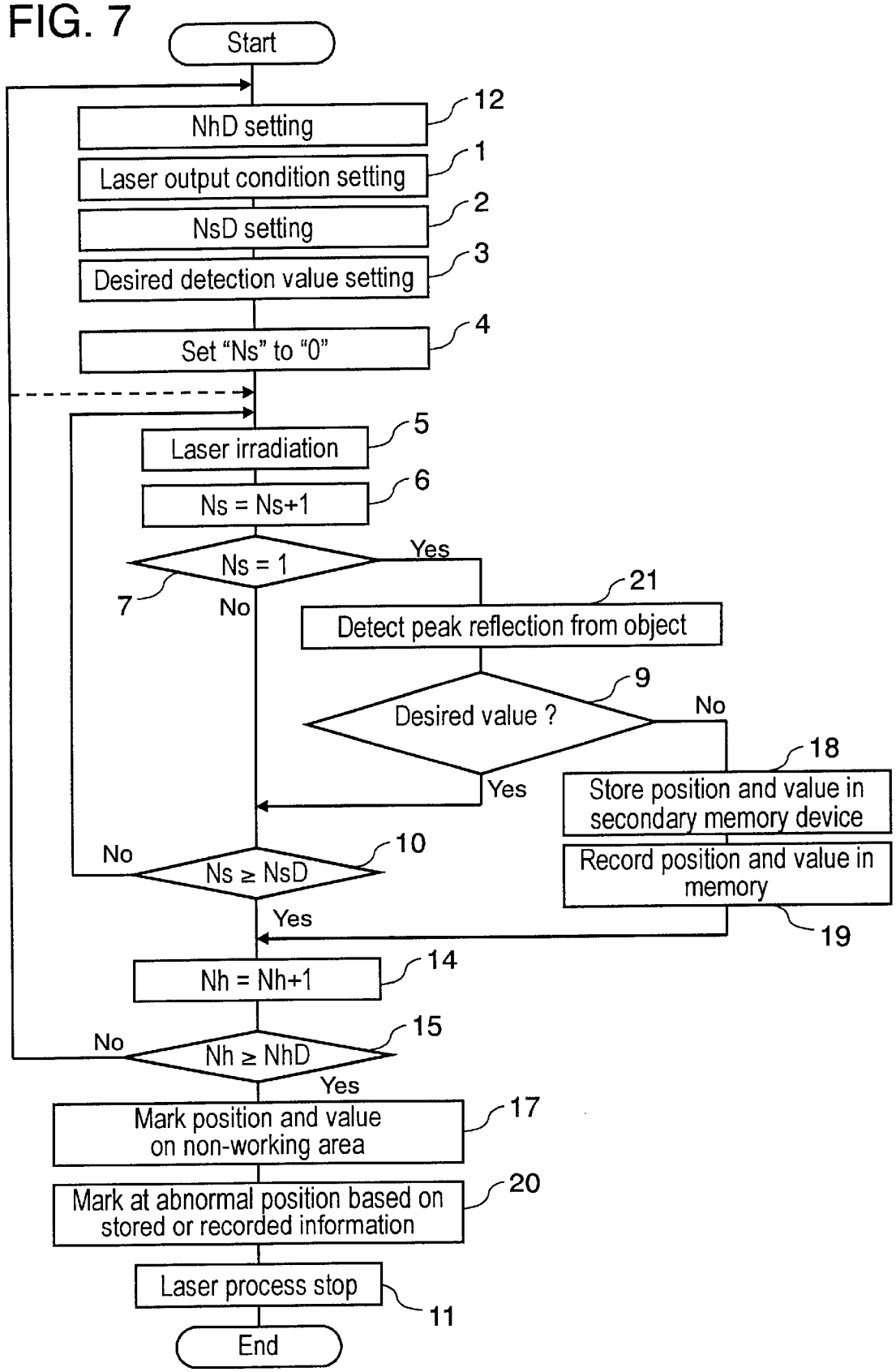
FIG. 7 is a schematic diagram of a laser processing method showing a further different embodiment of the invention.

FIG. 7 is a schematic diagram of a laser processing method showing a further different embodiment of the invention. In FIG. 7, to avoid duplication of description, only the parts different from those in FIG. 6 are explained herein.

In the laser processing apparatus of FIG. 7, the detecting step 8 of FIG. 6 is replaced by peak detecting step 21.

At peak detecting step 21, the laser processing apparatus detects the peak value of the reflected laser beam from the multi-layer printed circuit board, and uses this peak value as the detected value. Then the laser processing apparatus goes to desired detection value judging step 9. This embodiment is advantageous in that since the peak value of the reflected laser beam is used, the laser processing apparatus can be improved in processing precision, in processing speed, and in processing quality.

Figure 8:
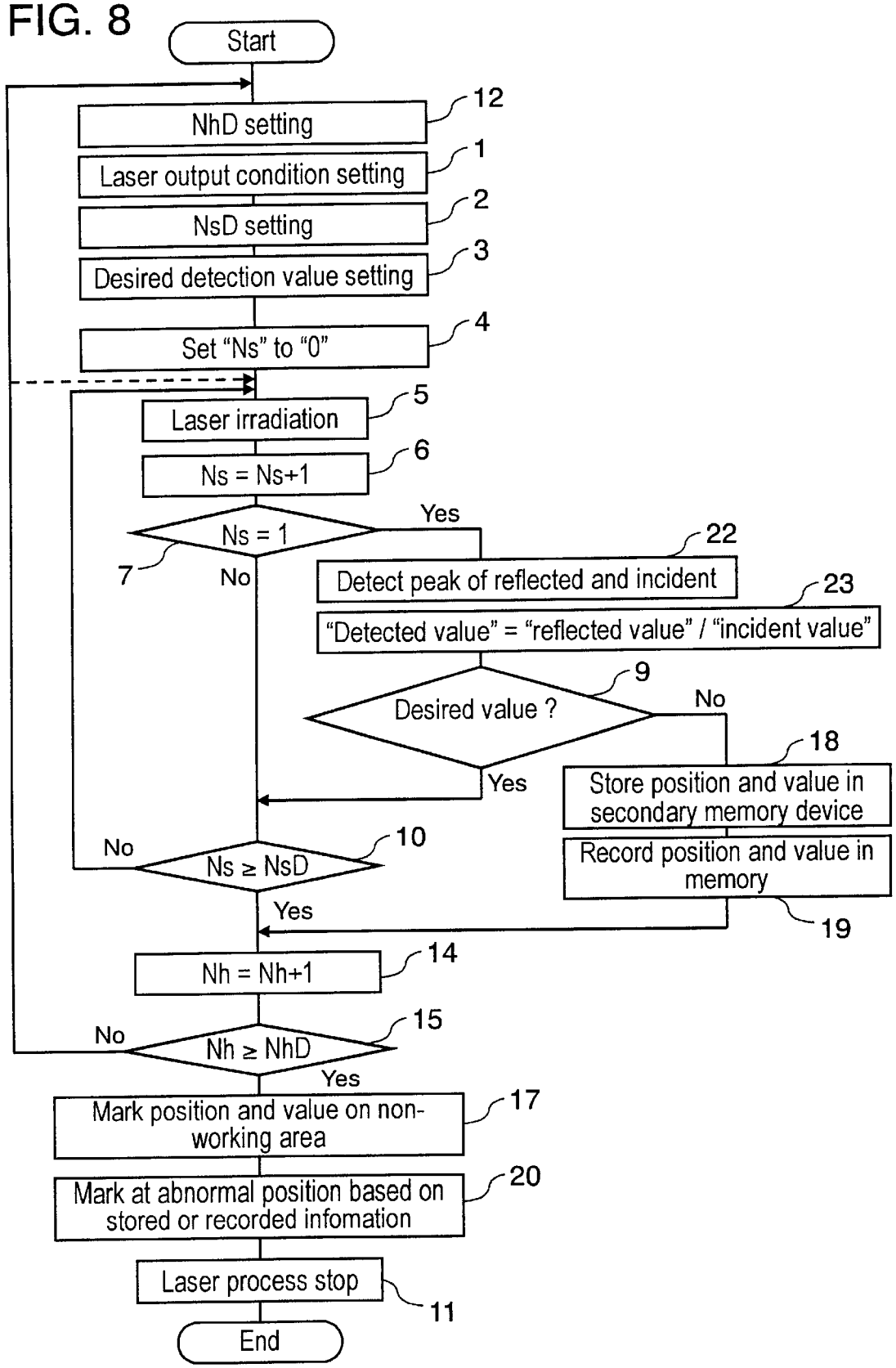
FIG. 8 is a schematic diagram of a laser processing method showing a further different embodiment of the invention.

FIG. 8 is a schematic diagram of a laser processing method showing a further different embodiment of the invention. In FIG. 8, to avoid duplication of description, only the parts different from those in FIG. 7 are explained herein. In the embodiment of FIG. 8, in contrast to the peak value, the detected value is obtained from both the reflected laser beam and the incident laser beam.

In the laser processing apparatus of FIG. 8, the reflected laser beam peak detecting step 21 of FIG. 7 is replaced by incident and reflected peak detecting step 22 and reflected and incident ratio detecting step 23. At the incident and reflected peak detecting step 22, the peak values of the incident laser beam to the object to be processed and the reflected laser beam therefrom are detected. At the reflected and incident ratio detecting step 23, the ratio of the reflected laser beam peak value to the incident laser beam peak value is obtained as a detected value (detected value=reflected peak value/incident peak value), which is transmitted to the desired detection value judging step 9. The subsequent process of the laser processing apparatus is the same as in FIG. 7.

This embodiment is advantageous in that since the ratio of incident laser beam peak value and reflected laser beam peak value is used, the processing precision of the laser processing apparatus can be further improved, and in that the processing speed is further accelerated, so as to realize high quality.

Figure 9:
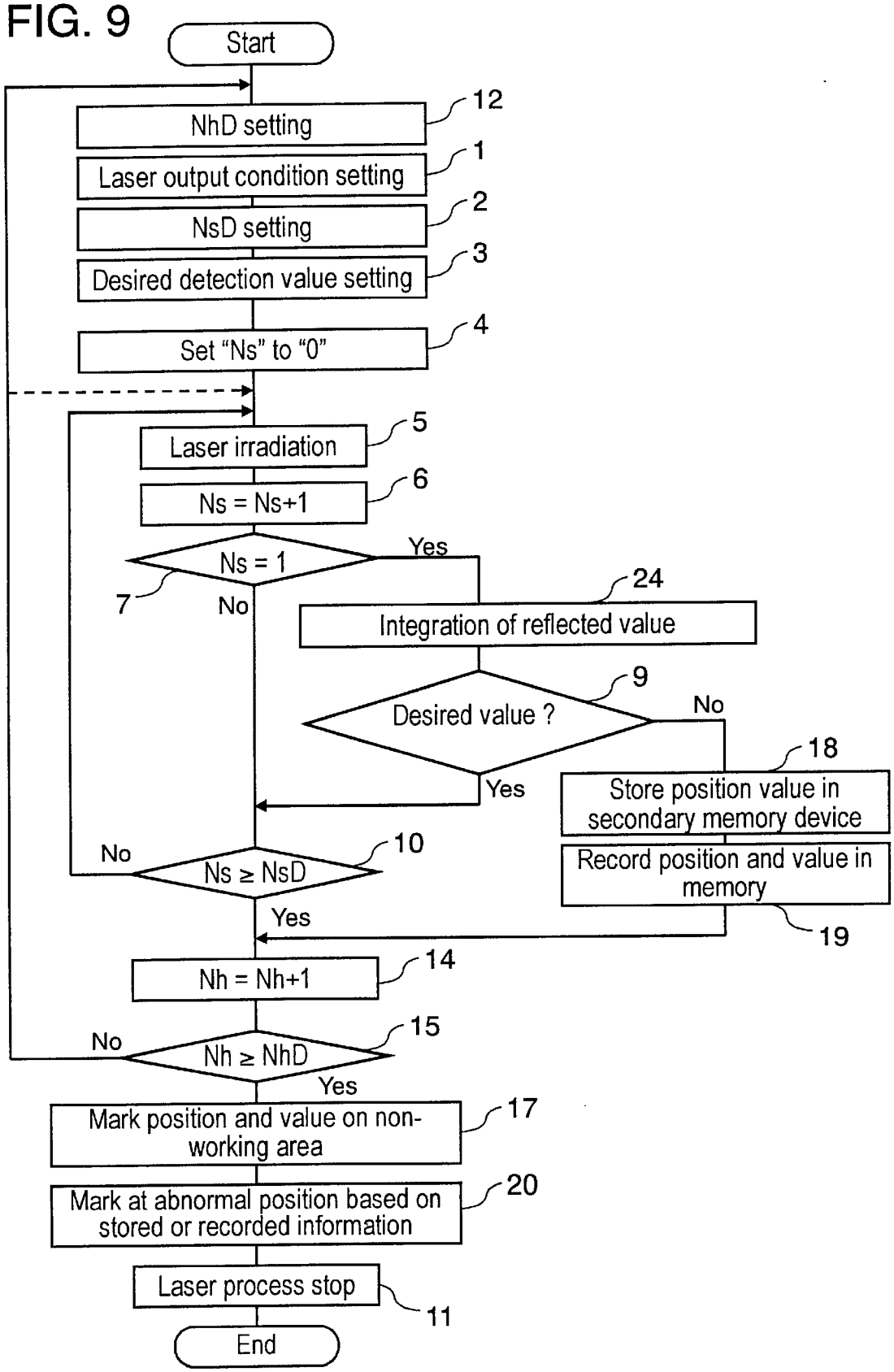
FIG. 9 is a schematic diagram of a laser processing method showing a further different embodiment of the invention.

FIG. 9 is a schematic diagram of a laser processing method showing a further different embodiment of the invention. In FIG. 9, to avoid duplication of description, only the parts different from those in FIG. 7 are explained herein. In the laser processing method of the embodiment in FIG. 9, different from FIG. 7, the integral value of the reflected laser beam is detected, and this integral value is used as the detected value.

In the laser processing apparatus of FIG. 9, the peak detecting step 21 of FIG. 7 is replaced by integration detecting step 24. The integration detecting step 24 detects the integral value of the reflected laser beam from the printed circuit board. The laser processing apparatus obtains the integral value of reflected laser beam at the integration detecting step 24 as the detected value, which is transmitted to the desired detection value judging step 9. The subsequent process of the laser processing apparatus is the same as in FIG. 7 or FIG. 8.

This embodiment is advantageous in that since the integral value of the reflected laser beam is used, the laser processing apparatus operates with stability.

Figure 10:
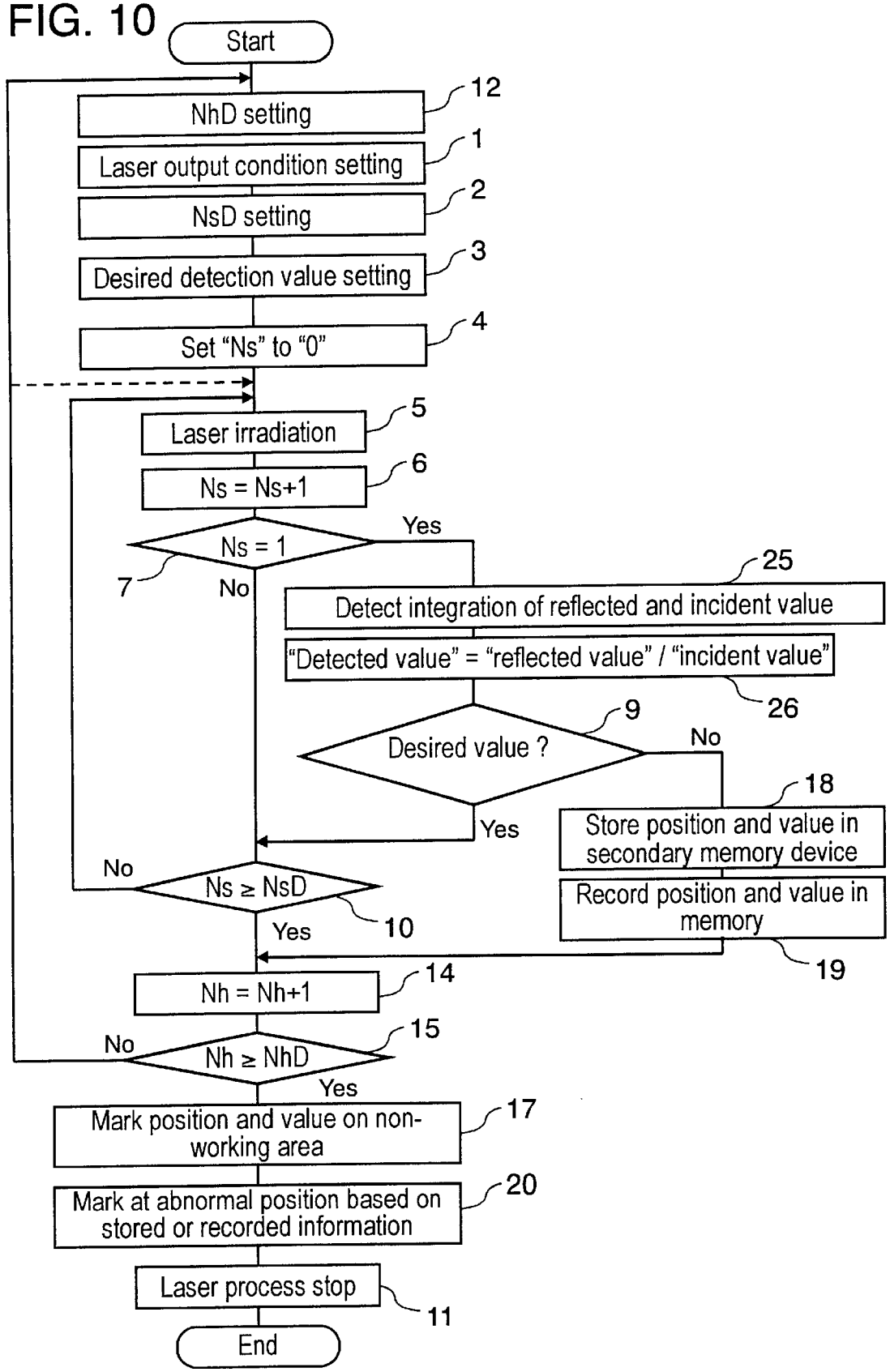
FIG. 10 is a schematic diagram of a laser processing method showing a further different embodiment of the invention.

FIG. 10 is a schematic diagram of a laser processing method showing a further different embodiment of the invention. In FIG. 10, to avoid duplication of description, only the parts different from those in FIG. 9 are explained herein. In the laser processing method of the embodiment of FIG. 10, different from FIG. 9, both the integral value of the reflected laser beam and integral value of the incident laser beam are detected. The value obtained by dividing the integral value of reflected laser beam by the integral value of incident laser beam is used as the detected value.

In the laser processing apparatus of FIG. 10, the reflected laser beam integration detecting step 24 of FIG. 9 is replaced by both incident and reflected integration detecting step 25 and reflected light/incident laser beam ratio detecting step 26. The incident laser beam and reflected laser beam integration detecting step 25 detects integral values of the incident laser beam to the printed circuit board and the reflected laser beam therefrom. The reflected light/incident ratio detecting step 26 calculates and normalizes the ratio of the integral value of reflected laser beam to the integral value of incident laser beam, and then obtains the detected value (detected value=integral value of reflected light/integral value of incident light), so as to eliminate any influence caused by fluctuations of laser output. The laser processing apparatus transmits this detected value to the desired value judging step 9. The subsequent process of the laser processing apparatus in FIG. 10 is the same as in FIG. 9.

This embodiment is further advantageous in that since the ratio of the integral value of the reflected laser beam to the integral value of incident laser beam is used, the laser processing apparatus has further improved stability.

Figure 11:
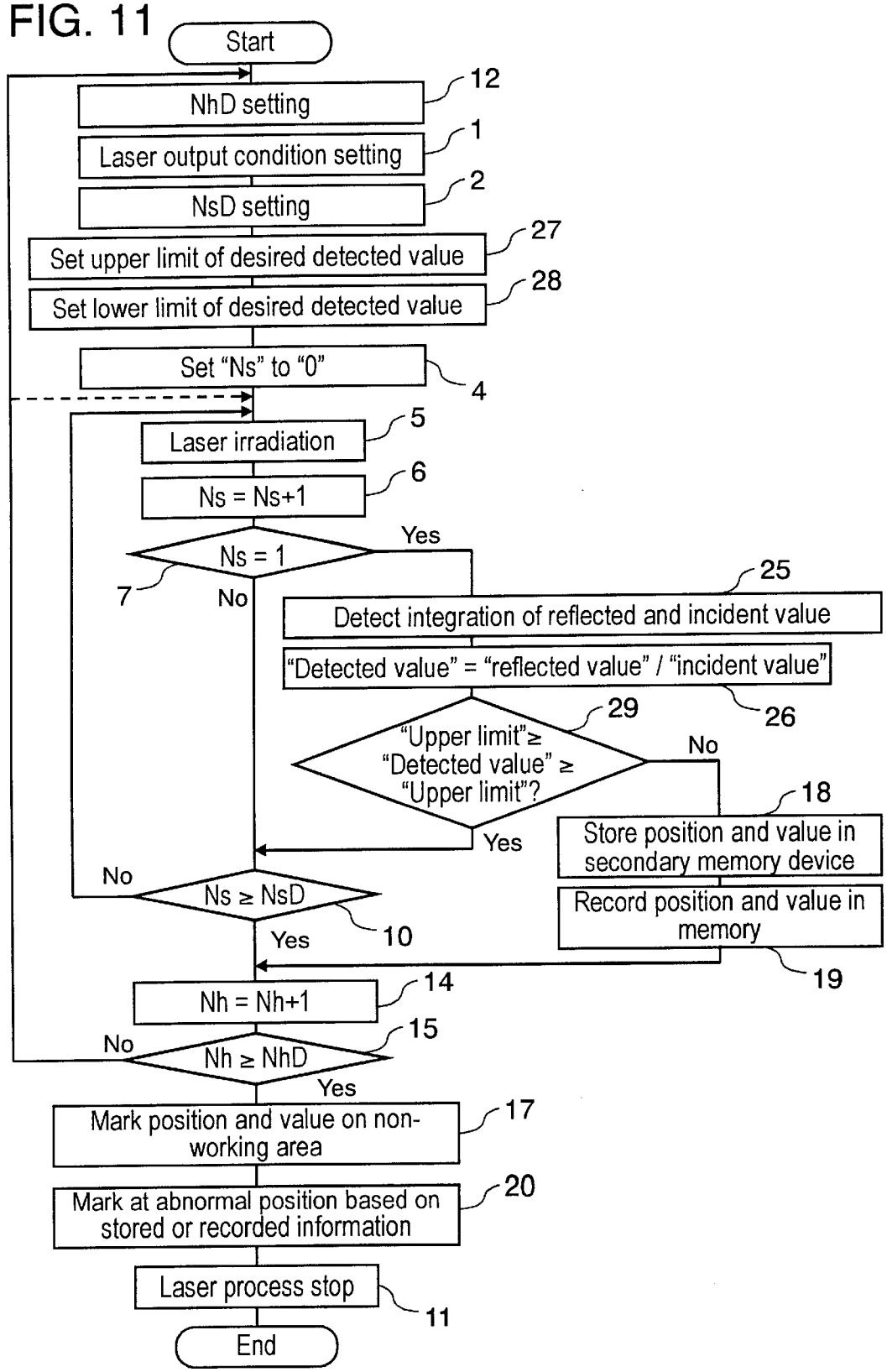
FIG. 11 is a schematic diagram of a laser processing method showing a further different embodiment of the invention.

FIG. 11 is a schematic diagram of a laser processing method showing a further different embodiment of the invention. In FIG. 11, to avoid duplication of description, only the parts different from those in FIG. 10 are explained herein. Other steps are same as in FIG. 10, and are not explained herein. In the laser processing method in the embodiment of FIG. 11, different from FIG. 10, lower limit and an upper limit of desired value of detection are determined, and the detected value is judged to be abnormal when the detected value is outside of the range between the lower limit and the upper limit.

In the laser processing apparatus of the embodiment, the desired laser irradiation NsD setting step 2 is followed by upper limit setting step 27 and lower limit setting step 28. The setting order of the upper limit and the lower limit may be reversed. The upper limit setting step 27 determines the upper limit of the desired detected value to be detected in processing. The lower limit setting step 28 determines the lower limit of desired detected value to be detected in processing.

On the other hand, after the reflected/incident ratio detecting step 26, the laser processing apparatus goes to the desired detection value judging step 29. The desired detection value judging step 29 judges if the reflected laser beam from the printed circuit board and the incident laser beam thereto are within the range of the desired lower limit and upper limit. When the detected value is within the range of the desired lower limit and upper limit, i.e. lower limit≦detected value≦upper limit, the laser processing apparatus goes to the irradiation judging step 10. When the detected values are not within the range of the desired lower limit and upper limit, i.e. lower limit>detected value, or detected value>upper limit, the laser processing apparatus goes to the abnormality storing step 18 for storing numerical values of position, diameter, and shape of the abnormal hole, and then to the recording step 19.

This embodiment is advantageous in that since laser processing is operated by judging if the detected value is within the desired lower limit and desired upper limit, the laser processing apparatus is further improved in processing precision , accelerated in processing speed, in high quality processing, and in stable and smooth operation.

Figure 12:
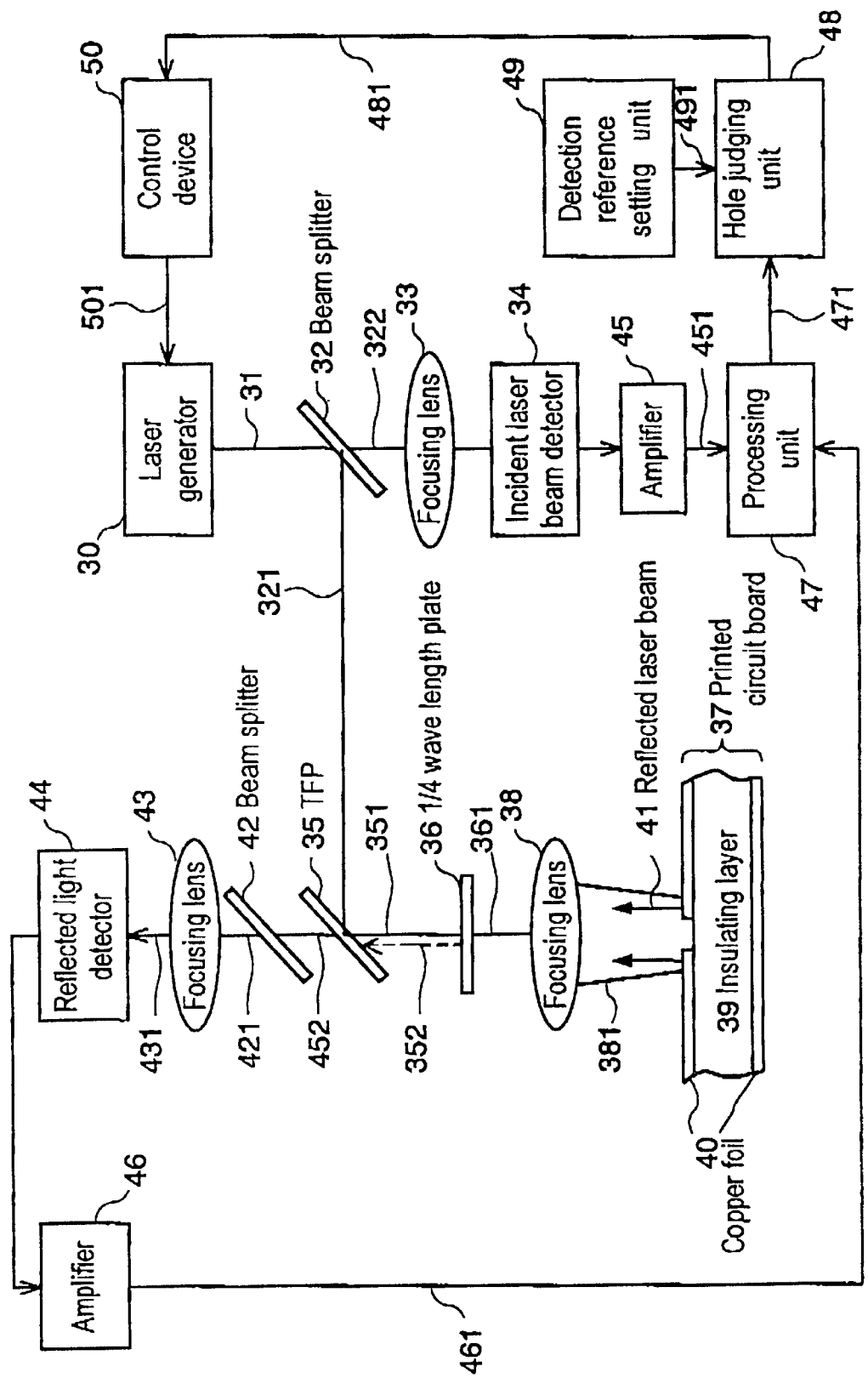
FIG. 12 is a schematic diagram of an embodiment of a laser processing apparatus for detecting position deviation of holes of copper foil of a printed circuit board, and abnormality of hole diameter or hole shape, as a laser processing apparatus relating to embodiments in FIG. 1 to FIG. 11 of the invention.

FIG. 12 shows a supplementary explanation of the laser processing method and apparatus relating to the embodiments of FIG. 1 to FIG. 11, and is an schematic diagram of an embodiment of laser processing apparatus for detecting position deviation of hole and abnormality of hole diameter and hole shape of the printed circuit board. FIG. 12 is for the most part common to FIG. 1 to FIG. 11, and is explained below.

A laser generator 30 generates laser beam 31. A beam splitter 32 splits the laser beam 31 into two beams. That is, the beam splitter 32 reflects the majority of laser beam 31 to obtain reflected laser beam 321, and allows the rest of the laser beam 31 to pass to obtain transmission laser beam 322. The reflected laser beam 321 is sent to the laser processing unit. The transmission laser beam 322 is used for correction of fluctuation of laser output.

A focusing lens 33 focuses the transmission laser beam 322, and sends it to an incident laser beam detector 34. The incident laser beam detector 34 detects the transmission laser beam 322, and amplifies it by an amplifier 45 to obtain an incident laser beam signal 451 which is sent to a signal processing unit 47.

A thin film polarizer (TFP) 35 polarizes and separates the reflected laser beam 321. That is, the TFP 35 polarizes the reflected laser beam 321 in the vertical direction, so as to obtain a vertically polarized light 351. A quarter wavelength ($\lambda/4$) plate 36 converts the vertically polarized laser beam 313 into a circular polarized laser beam 361. A focus lens 38 focuses the circular polarized laser beam 361, so as to obtain a focused laser beam 381. The focused laser beam 381 is applied to a printed circuit board 37, and a reflected laser beam 41 is obtained and used in processing.

During laser processing, the focused laser beam 381 is absorbed in an insulating layer 39 exposed at the hole of a copper foil 40 of the printed circuit board 37. On the other hand, the copper foil 40 of the printed circuit board 37 reflects the focused laser beam 381, so as to obtain the reflected laser beam 41. When the laser beam 381 is applied to a normal hole, a specific reflected laser beam 41 from the copper foil surface is detected, but no reflected laser beam 41 is detected in the area of insulating layer 39. The hole (area of no copper foil) of the copper foil 40 is made by etching or the like. If, however, the position of the hole of the copper foil 40 of the surface layer is deviated from the design value or desired value, if the shape of the hole is distorted, or if the hole diameter is smaller, the reflected light 41 is usually larger than a specified value. As a result, abnormality of hole is detected. If the focused laser beam 381 detects this abnormality, then the system stops and does not make a hole in the insulating layer 39. If the focused laser beam 381 detects no abnormality, then the system makes a hole in the insulating layer 39.

The reflected laser beam 41 reflected on the surface of the copper foil 40 of the board 37 returns to the TFP 35 in the laser beam route. The circular polarized vector of the focused laser beam 381 is inverted in the direction of polarization when it is reflected on the surface of the copper foil. The quarter wavelength ($\lambda/4$) plate 36 converts the reflected laser beam 41 to a linear polarized laser beam 352 with a plane of polarization is in the horizontal direction. This time, the TFP 35 allows the linear polarized laser beam 352 to pass. The beam splitter 42 weakens the intensity of the linear polarized laser beam 352. The focus lens 43 focuses the weakened linear polarized laser beam 421, so as to obtain a reflected focused laser beam 431. A reflected laser beam detector 44 detects the reflected focused laser beam 431. Herein, the beam splitter 42 may be omitted depending on the intensity of laser beam passing through the TFP 35, or the intensity of the reflected focused laser beam 431 to be entered in the reflected laser beam detector 44.

Amplifier 46 amplifies a signal from the detector 44 based on the reflected and focused laser beam 431, and sends an amplified signal 461 to the signal processing unit 47.

The signal processing unit 47 processes an incident laser beam signal 451 obtained from the incident laser beam 31 and the reflected and amplified signal 461 obtained from the reflected light 41, so as to generate a normalized signal 471. The normalized signal 471 is sent to a hole judging unit 48. The hole judging unit 48 compares the normalized signal 471 with a criterion 491 obtained in the detection reference setting unit 49, so as to obtain a judgement signal 481. A control device 50 generates a control signal 501 depending on the judgement signal 481, and the control signal 501 controls the laser generator 30, so as to correct the fluctuation of laser output.

In the detection reference setting unit 49, the criterion 491 is determined for the normal hole or abnormal hole preliminarily. The hole judging unit 48 judges the hole is normal when the detection signal 471 is within the criterion 491. When the detection signal 471 is outside of the criterion 491, it is judged that there is an abnormality in position, diameter or shape of the hole.

For example, the normalized signal 471 is produced as follows. The signal processing unit 47 divides the reflected laser beam signal 461 by the incident laser beam signal 451, so as to generate a normalized signal 471 (normalized signal=reflected laser beam signal/incident laser beam signal). Herein, the intensity of the reflected laser beam signal 461 is corrected as required. The actual correction is as follows. The reflected laser beam reflected from the copper foil 40 of the board 37 may not return completely (100%) to the reflected laser beam detector 44. In consideration of such a case, the percentage of the reflected laser beam 41 returning from the working position of the printed circuit board 37 is prepared in a coefficient table, and the reflected laser beam signal 461 is corrected according to the coefficient table in the coordinates of each working position. For example, when processing a hole in certain coordinates, if the rate of the reflected laser beam returning from the coordinates is 80%, and the reflected laser beam signal detected in the reflected laser beam detector 44 is 8 V, the coefficient of the position is 0.8. Hence, dividing 8 V by the coefficient 0.8, the reflected laser beam 461 is corrected as 8/0.8=10 V.

In this embodiment, the signal is amplified by using the amplifier 45 or 46, but if the signal sent out from the incident laser beam detector 34 or reflected laser beam detector 44 is sufficiently large, the amplifier 45 or 46 is not always required. The laser may generate the laser beam in a pulse train or continuously depending on the object to be processed.

A bench for mounting the printed circuit board used in the embodiment may be either a fixed bench or a movable bench moving, for example, in the XY direction of the apparatus. The same results are obtained in both cases.

The scanning mirror of the optical system may be, for example, galvano-mirror, polygonal mirror, mirror using phono-optical element, a mirror using electro-optical element, or hologram scanner. The same action and effect are obtained by any one of these mirrors.

The focus lens for processing may be, for example, F$\theta$ lens (multi-focus lens), single focus lens, and multiple combination of Fresnel lenses. The same action and effect are obtained by any one of these lenses.

As a laser processing method, the laser may be emitted continuously to one hole, or the laser may be applied to plural holes existing in a certain working area in turn cyclically, which is known as a cyclic process. The same results in action and effect are obtained by either method.

The type of the laser generation mode or the type of the laser to be used depends on the material of the printed circuit board. For example, when the printed circuit board is a glass fiber reinforced resin circuit board, laser of long wavelength, for example, a carbon dioxide ($CO_2$) laser of 10.6 $\mu$m is used, or in a case of an ordinary resin circuit board, a YAG laser or Excimer laser is used, or their second-order or third-order higher harmonics of the laser beam may be used.

In the embodiment, an abnormal working position is marked with a circle or the like by laser, but the same effect is obtained by marking a circle by stamp or other printing method. Also, the same effect is obtained by marking a hole of an abnormal working position manually.

Further, a camera monitoring system which is not shown in the drawings may be used. The laser processing apparatus of the invention further comprises a video camera, a monitor display showing the image being taken by the video camera, a bench on which a circuit board is mounted as the object to be processed, means for moving the relative positions of the video camera and bench, for example in the X-Y direction, and means for controlling the relative positions corresponding to irradiation of laser beam. Accordingly, the video camera takes the image of the working position during laser beam irradiation, and the operator can observe the state of the working position on the screen of the monitor display.

It is advantageous that by moving a camera (not shown in the drawings) or bench in relative position regarding to an abnormal hole position and using a suited inspection program, the operator can easily and precisely inspect the abnormal hole position and hole shape.

The same variations as described above are applied to the foregoing embodiments of FIG. 1 to FIG. 11, and also to the following embodiments shown in FIG. 13 to FIG. 23. Therefore, as the explanation relating these points is the same in all embodiments, repetition of the same explanation is omitted hereinafter.

Figure 13:
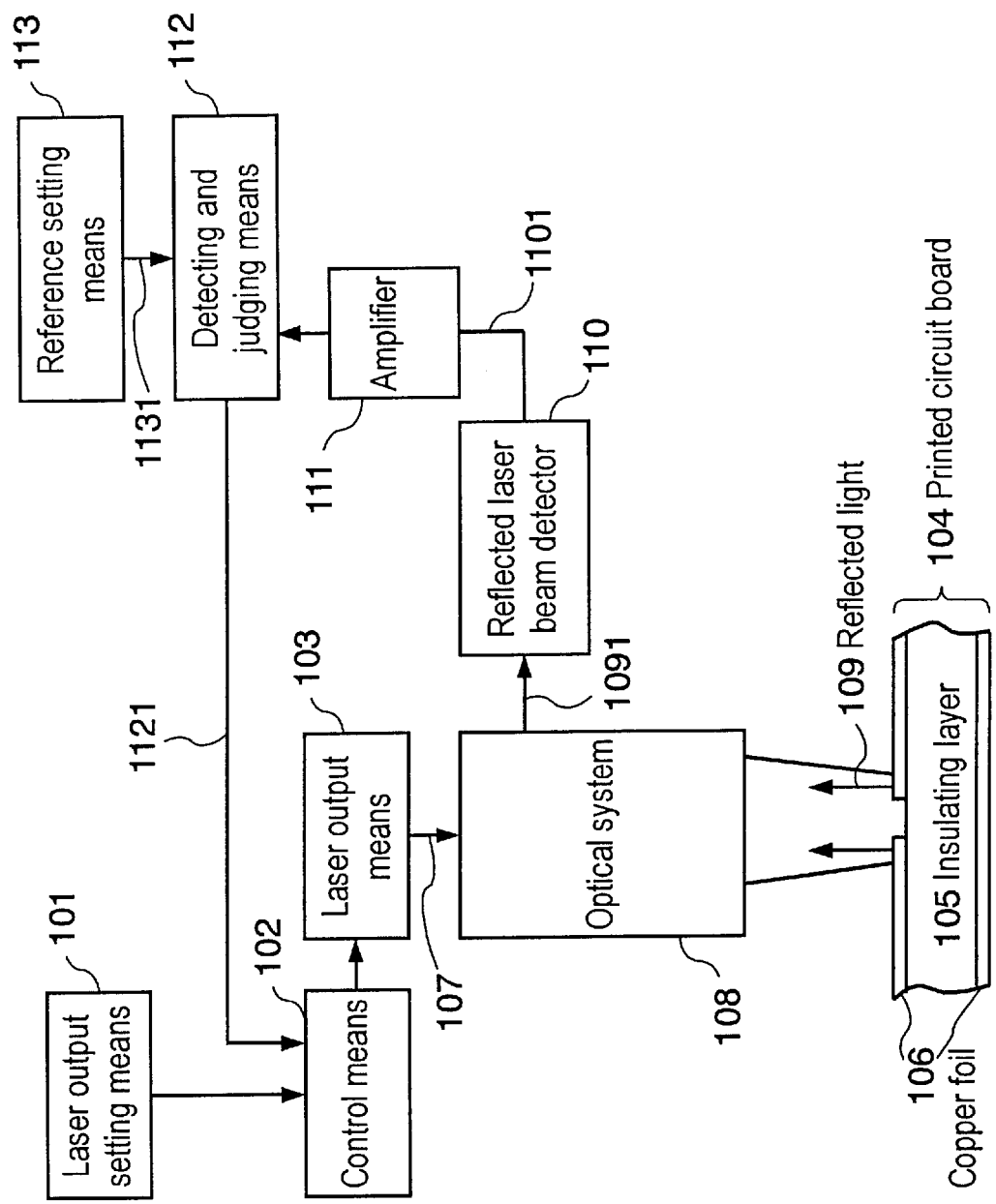
FIG. 13 is a schematic diagram of a laser processing apparatus showing another embodiment of the invention.

FIG. 13 is a schematic diagram of a laser processing apparatus showing another embodiment of the invention.

The laser processing apparatus in FIG. 13 emits a laser beam and processes the insulating layer corresponding to the holes in the circuit board including at least two layers, that is, the conductive layer having a plurality of holes disposed on the surface layer of the insulating layer to be processed. The laser processing apparatus comprises means for irradiating a laser beam, means for detecting a reflected laser beam, means for stopping laser processing of the insulating layer when the detection of the reflected laser beam is an abnormal value outside of the desired value, and means for processing the insulating layer corresponding to the holes when the detection of the reflected laser beam is a desired value.

Laser output setting means 101 sets the laser output number and the laser output condition, which are the laser processing condition. The laser output number is the actual number of working positions or hole number in the printed circuit board. The laser output condition shows the laser output energy and working dimensions in individual working positions. The laser output setting means 101 sends the processing conditions, including the laser output number and laser output condition, to control means 102. The control means 102 controls a laser output means 103 to emit a laser beam 107 to an optical system 108 based on the processing condition set by the setting means 101. The optical system 108 applies the laser beam 107 to the object to be processed, that is, printed circuit board 104. The laser beam 107 applied to the printed circuit board 104 first inspects the state of a copper foil 106 near the working position before processing of the insulating layer. At this time, the copper foil 106 on the surface of the printed circuit board 104 reflects this first laser beam 107, and returns the reflected laser beam 109 to the optical system 108. In the area where the copper foil has been removed by etching beforehand, the insulating layer 105 is exposed. The exposed area of the insulating layer 105 absorbs the laser beam 107. The reflected laser beam 109 from the copper foil 106 advances in an optical path reverse to laser irradiation, and reaches the optical system 108. The optical system 108 separates the reflected laser beam 109 by its internal separating optical system. The separated reflected laser beam component 1091 is guided into a reflected laser beam detector 110. The reflected laser beam detector 110 detects the reflected laser beam 109, and transmits a detection signal 1101 to an amplifier 111. The amplifier 111 amplifies the detection signal 1101, and transmits it to detection judging means 112. The detection judging means 112 compares the amplified detection signal 1101 with a specified criterion 1131 preset in reference setting means 113, and judges if the amplified detection signal 1101 is within the specified criterion 1131 or not. The detection judging means 112 sends the result 1121 of judgement to the control means 102. The control means 102 stops the laser processing if the amplified detection signal 1101 is outside of the specified criterion 1131, and on the other hand, continues the hole making in the insulating layer 105 of the circuit board 104 when the amplified detection signal 1101 is within the specified criterion 1131.

The reflected laser beam 109 reflected from the copper foil 104 of the printed circuit board 104 may not return completely (100%) to the reflected laser beam detector 110. In consideration of such a case, the same as in the embodiment in FIG. 12, the percentage of the reflected laser beam 109 returning to the working position of the printed circuit board 107 is prepared in a coefficient table, and the detection signal 1101 is corrected according to the coefficient table in the coordinates of each working position. For example, when processing a hole in certain coordinates, if the rate of the reflected laser beam returning from the coordinates is 80%, and the detection signal 1101 is 8 V, the coefficient of the position is 0.8. Hence, dividing 8 V by the coefficient 0.8, the amplified detection signal 1101 is corrected as 8/0.8=10 V.

It is advantageous that as laser processing stops when there is any abnormality in the position, diameter or shape of the copper foil, so without requiring an extra step of inspection, it is possible to process the printed circuit board while judging presence or absence of abnormality.

Figure 14:
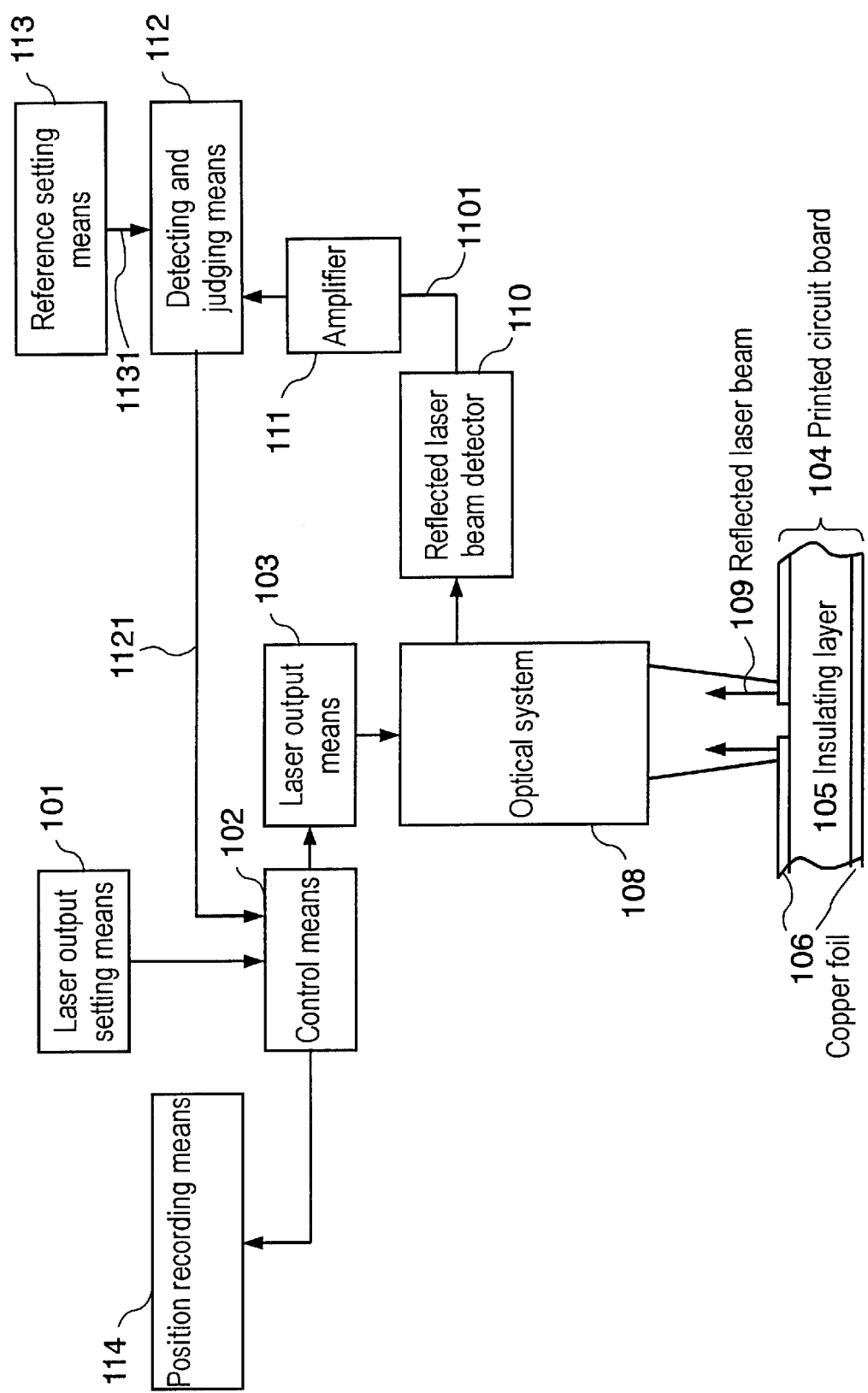
FIG. 14 is a schematic diagram of a laser processing apparatus showing a different embodiment of the invention.

FIG. 14 is a schematic diagram of a laser processing apparatus showing a different embodiment of the invention corresponding to the laser processing method in FIG. 2. The embodiment in FIG. 14 is mostly the same as the embodiment in FIG. 13, and duplicate explanation is avoided. The embodiment in FIG. 14 differs from FIG. 13 in that position recording means 114 for recording the position of an abnormal hole is added. Therefore, the position recording means 114 is mainly explained here.

The detection judging means 112 sends the result 1121 of judgement to the control means 102. When the amplified detection signal 1101 is outside of the desired criterion 1131, the control means 102 records the working position in the position recording means 114, and stops the laser processing of the hole. When the amplified detection signal 1101 is within the desired criterion 1131, the control means 102 continues to make the laser output means 103 emit the laser beam so as to process the hole.

Thus, the embodiment is advantageous in that since the position of abnormal hole is kept in the position recording means 114, the recorded data can be useful for in re-inspection after processing, re-processing and post-processing. As a result, an overall yield is improved.

Figure 15:
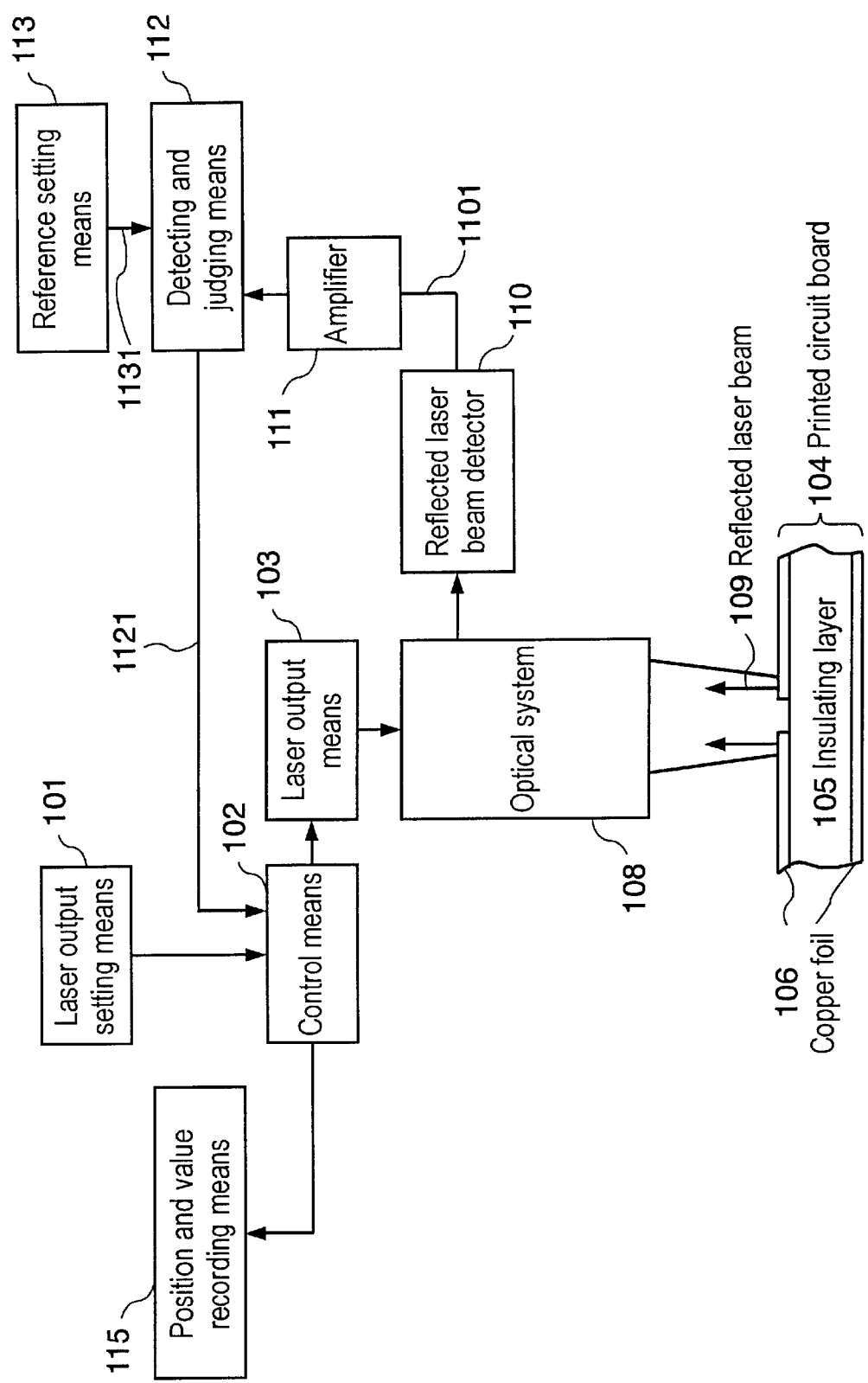
FIG. 15 is a schematic diagram of a laser processing apparatus showing a further different embodiment of the invention.

FIG. 15 is a schematic diagram of a laser processing apparatus showing a further different embodiment of the invention corresponding to the laser processing method of FIG. 3. The laser processing apparatus in the embodiment of FIG. 15 differs from FIG. 14 in that the position recording means 114 in FIG. 14 is replaced by the means for recording the position and abnormal value of abnormal hole, that is, position and value recording means 115. The embodiment of FIG. 15 is mostly the same as the embodiment of FIG. 14, and in order to avoid duplicate explanation, herein, mainly the position and value recording means 115 is explained.

The detection judging means 112 sends the result 1121 of judgement to the control means 102. When the amplified detection signal 1101 is outside of the desired criterion 1131, the control means 102 records the working position and detected value, as the result of detection, in the position and value recording means 115, and then stops the laser processing of the hole. When the amplified detection signal 1101 is within the desired criterion 1131, the control means 102 continues to make the laser output means 103 emit the laser beam so as to process the hole.

Thus, the embodiment is advantageous in that abnormality in the position, diameter or shape of hole of copper foil can be judged without requiring any extra step for inspection. It is further advantageous that since the position of all abnormal holes and its detected value are recorded, they can be utilized in re-inspection after processing, re-processing and post-processing.

Figure 16:
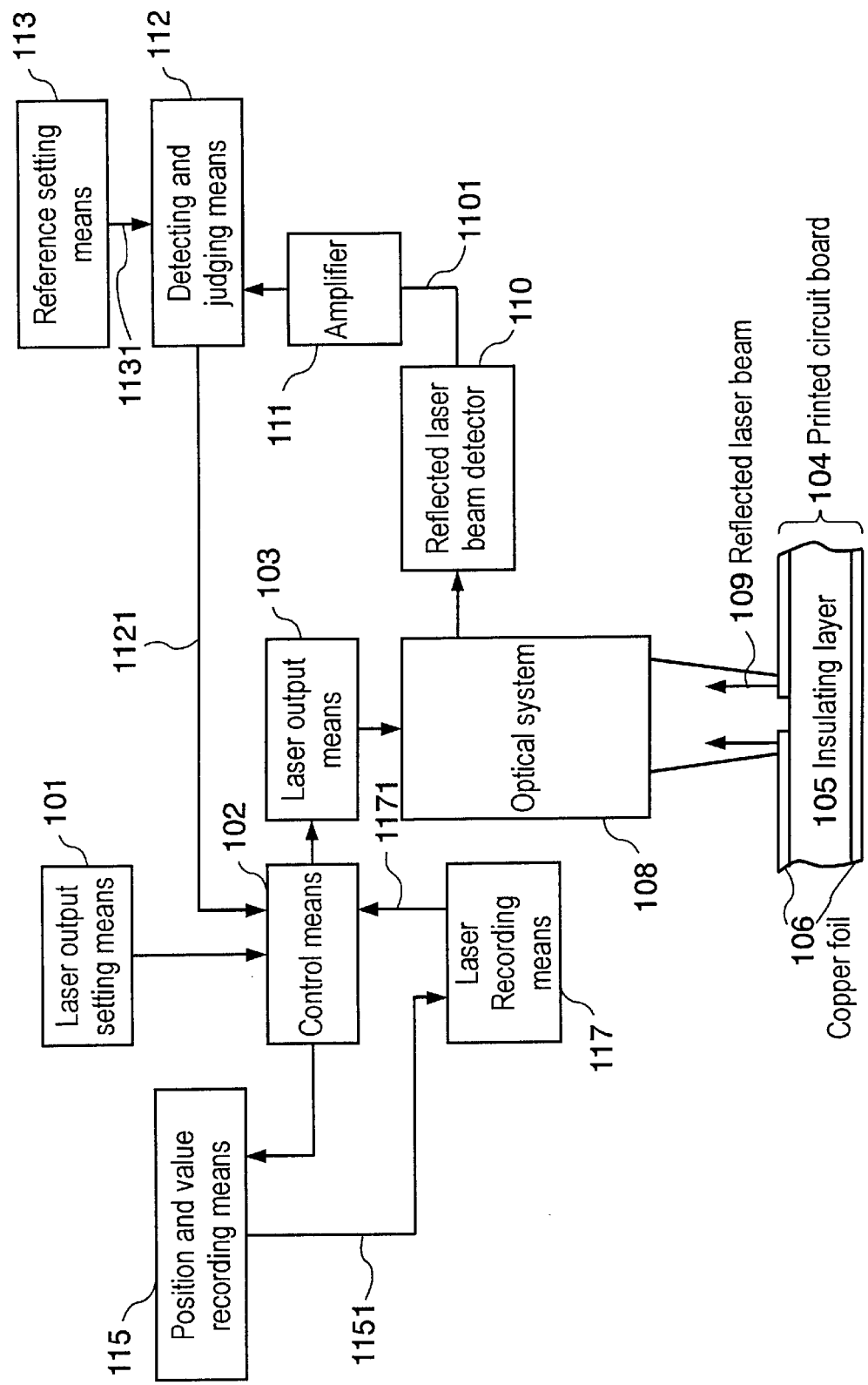
FIG. 16 is a schematic diagram of a laser processing apparatus showing a further different embodiment of the invention.

FIG. 16 is a schematic diagram of a laser processing apparatus showing a further different embodiment of the invention corresponding to the laser processing method of FIG. 4. The laser processing apparatus in the embodiment of FIG. 16 differs from FIG. 15 in that it further comprises means for recording the position of abnormal hole and/or abnormal value and means for marking the information about position of abnormal hole and/or abnormal value in a non-working area of the circuit board.

The embodiment in FIG. 16 is mostly the same as the embodiment in FIG. 15, and in order to avoid duplicate explanation, herein, relating to the position and value recording means 115, mainly the recording means 117 and marking means(not shown in the drawings) are explained.

The detection judging means 112 sends the result 1121 of judgement to the control means 102. When the amplified detection signal 1101 is outside of the desired criterion 1131, the control means 102 records the working position and detected value, as the result of detection, in the position and value recording means 115, and then stops the laser processing of the hole. When the amplified detection signal 1101 is within the desired criterion 1131, the control means 102 continues to make the laser output means 103 emit the laser beam so as to process the hole.

In succession, the laser processing apparatus repeats this operation until the processing of all holes on the printed circuit board 104 is completed. As a result, the position and value recording means 115 records all data 1151 including position, diameter and shape of all abnormal holes. When processing of all holes is over, finally, the position and detected value recording means 115 sends the data 1151 to the recording means 117. The recording means 117 compiles marking data 1171 based on the data 1151, and sends it to the control means 102. The control means 102 controls the laser output means 103 and optical system 108 based on the marking data 1171, so as to mark the marking data 1171 as character data or symbols in the non-working area of the printed circuit board.

Thus, the embodiment is advantageous in that the operator can utilize the data 1151 recorded in the position and detected value recording means 115 in re-inspection after processing, re-processing and post-processing. It is advantageous that the operator can visually recognize the marking data 1171 marked in characters on the surface of the printed circuit board, and hence, can re-inspect or re-process smoothly according to the marking data 1171.

Figure 17:
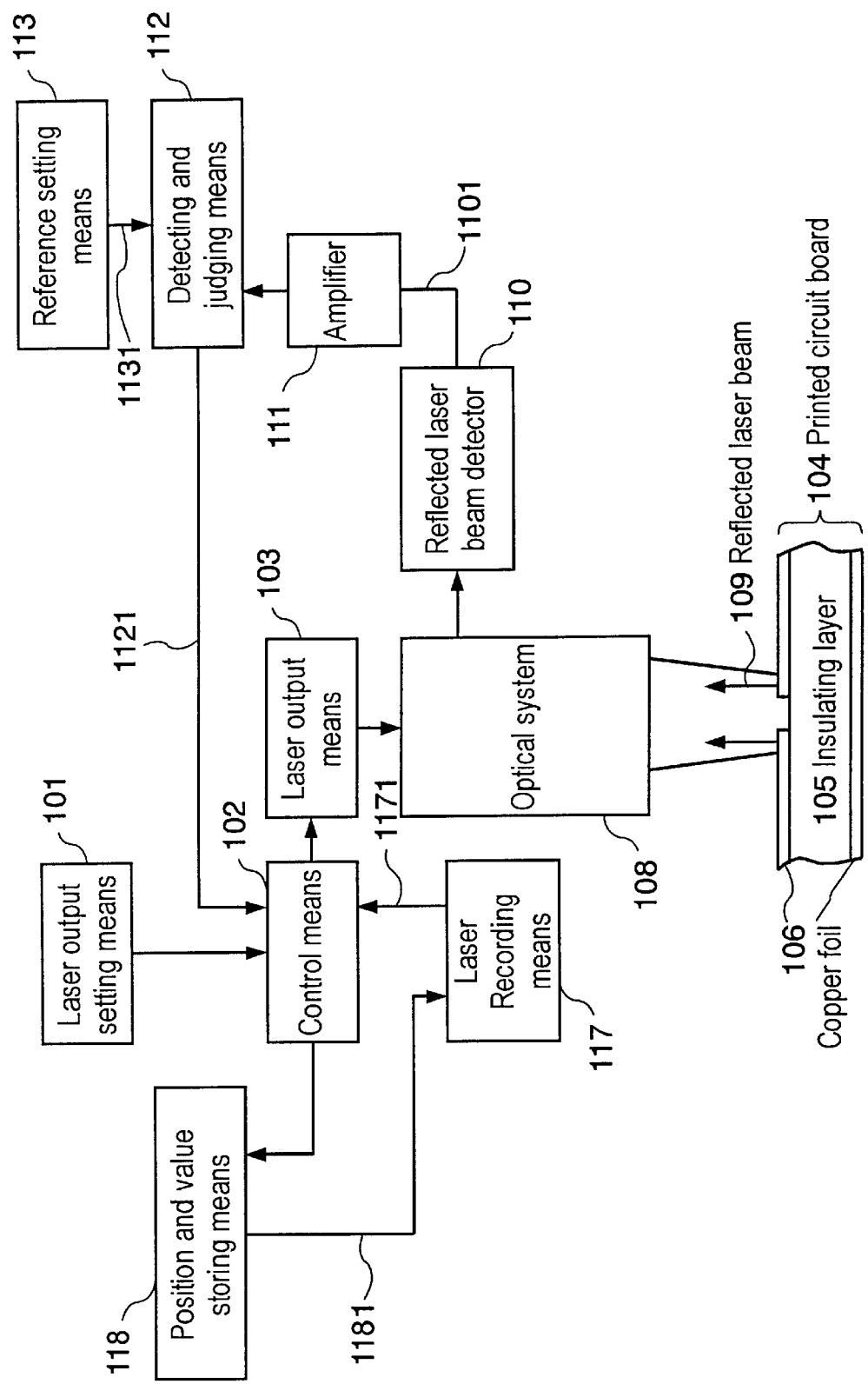
FIG. 17 is a schematic diagram of a laser processing apparatus showing a further different embodiment of the invention.

FIG. 17 is a schematic diagram of a laser processing apparatus showing a further different embodiment of the invention corresponding to the laser processing method of FIG. 5. The laser processing apparatus differs from FIG. 16 in that it further comprises means for storing at least one of the position of abnormal hole and abnormal value in secondary storage means such as a hard disk drive, that is, position and detected value storing means 118.

The embodiment of FIG. 17 is the same as the embodiment of FIG. 16 in other parts, and in order to avoid duplicate explanation, herein, only the parts relating to the position and detected value storing means 118 are explained.

The detection judging means 112 sends the result 1121 of judgement to the control means 102. When the amplified detection signal 1101 is outside of the desired criterion 1131, the control means 102 records the data 1181, such as working position and detected value, as the result of detection in the position and value storing means 118, and then stops the laser processing of the hole. When the amplified detection signal 1101 is within the desired criterion 1131, the control means 102 continues to make the laser output means 103 emit the laser beam so as to process the hole. Although the storage device such as a hard disk drive is used for the position and value storing means 118 in this embodiment, for example, other secondary storage devices such as a floppy disk, CD-RAM, or DVD-RAM may also be used for the position and value storing means 118. The recording means 117 compiles marking data 1171 based on the data 1181 stored in the position and value storing means 118, and then sends the marking data to the control means 102. The other operation is the same as in FIG. 16.

Thus, the embodiment is advantageous in that the operator can utilize the data 1181 stored in the position and value storing means 118 in re-inspection after processing, re-processing and post-processing. For example, the operator can visually recognize the marking data 1171 marked in characters on the surface of the printed circuit board, and hence, can re-inspect or re-process more smoothly. It is further advantageous that since the data 1181 stored in the position and value storing means 118 such as a hard disk drive can be connected to another computer or the like and the information can be processed, so that the data 1181 can be utilized in process control or quality control.

Figure 18:
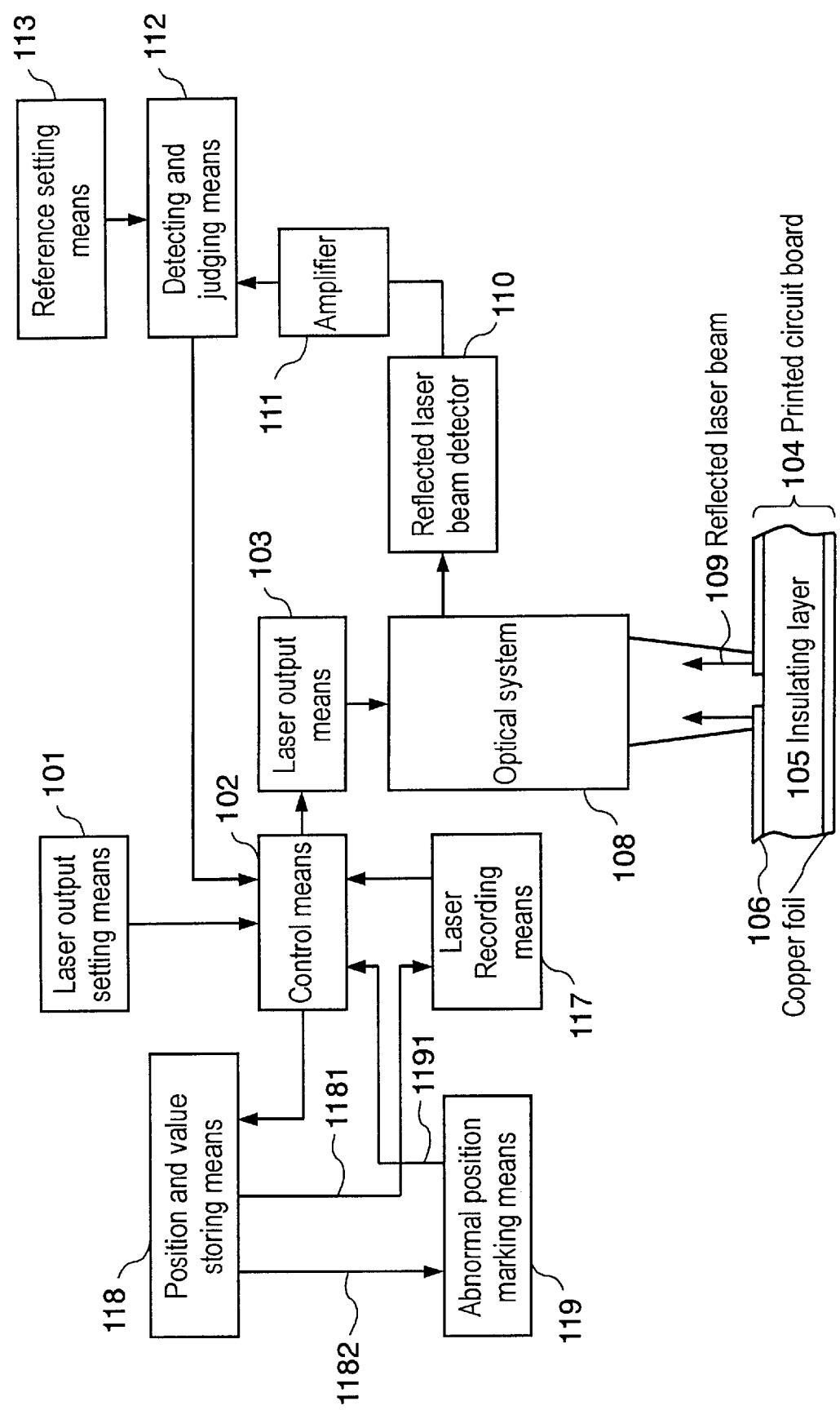
FIG. 18 is a schematic diagram of a laser processing apparatus showing a further different embodiment of the invention.

FIG. 18 is a schematic diagram of a laser processing apparatus showing a further different embodiment of the invention corresponding to the laser processing method of FIG. 6. The laser processing apparatus in FIG. 18 differs from FIG. 17 in that it further comprises means for marking the information about abnormal hole in the non-working area near the corresponding abnormal hole, that is, abnormal position marking means 119.

The embodiment in FIG. 18 is the same as the embodiment in FIG. 17 in other parts, and in order to avoid duplicate explanation, herein, only the parts different from FIG. 17, that is, the added abnormal position marking means 119, is mainly explained.

The abnormal position marking means 119 converts the data 1182 stored in the position and detected value storing means 118 such as a hard disk drive into marking data. For example, abnormal position data 1182 is converted into marking data 1191 such as a circle, character, numeral or other symbol to be marked around the hole. Not limited to position data, for example, information about the abnormal value may be marked. According to the marking data 1191, the control means 102 controls the laser output means 103 and optical system 108 in turn, so as to then mark the circle, character, numeral or other symbol on the surface of free space near the abnormal part of the printed circuit board 104.

It is advantageous, therefore, that the operator can see the mark and recognize abnormality in processing, and also can refer to the data 1181 of the position and detected value storing means 118, and that he can re-inspect the printed circuit board 104 quickly, and also can inspect or correct and process the printed circuit board 104 adequately. As a result, the yield of the printed circuit boards can be further improved.

Figure 19:
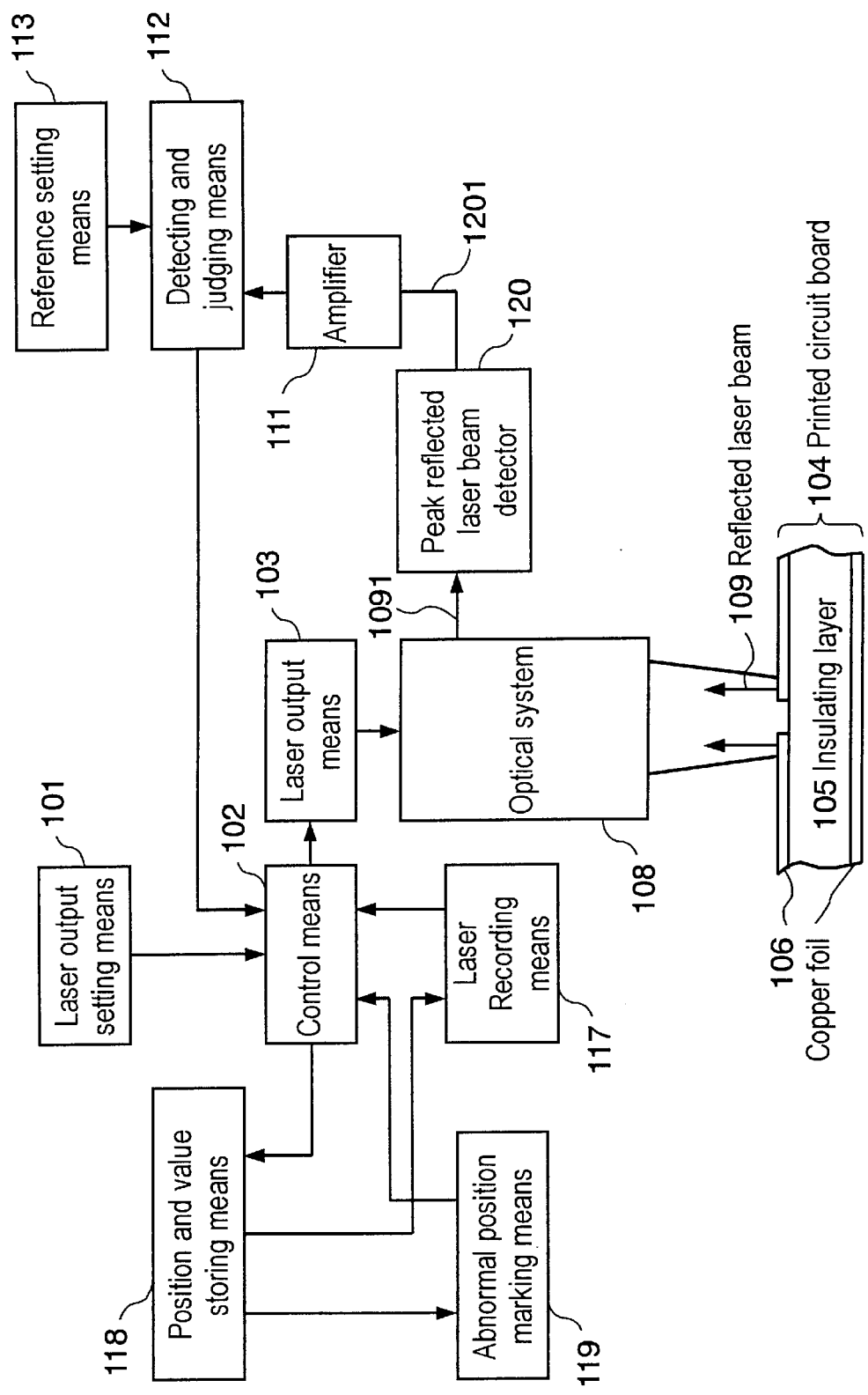
FIG. 19 is a schematic diagram of a laser processing apparatus showing a further different embodiment of the invention.

FIG. 19 is a schematic diagram of a laser processing apparatus showing a further different embodiment of the invention corresponding to the laser processing method in FIG. 7. The laser processing apparatus differs from FIG. 18 in that the reflected light detecting means 110 in FIG. 18 is replaced by means 120 for detecting the peak value of reflected light, and that this peak value is used as the detected value.

The embodiment in FIG. 19 is the same as the embodiment in FIG. 18 in other parts, and in order to avoid duplicate explanation, herein, only the part different from FIG. 18, that is, the reflected light peak detecting means 120 is mainly explained.

In the hole inspection mode just before the hole processing, the reflected laser beam 109 from the copper foil 106 of the printed circuit board 104 advances in the optical path reverse to laser irradiation, and then reaches the optical system 108. The optical system 108 separates the reflected laser beam 109 by its internal separating optical system. The separated reflected component 1091 is guided into the peak detector 120. The peak detector 120 detects the peak value 1201 of the reflected component 1091, and then transmits a peak value 1201 to the amplifier 111.

The subsequent operation of the laser processing apparatus is the same as in the foregoing embodiment, and is not explained herein.

Thus, the embodiment is advantageous in that since the laser processing apparatus makes use of the peak value 1201 of the reflected laser beam in the inspection mode, the speed and precision of inspection are improved.

Figure 20:
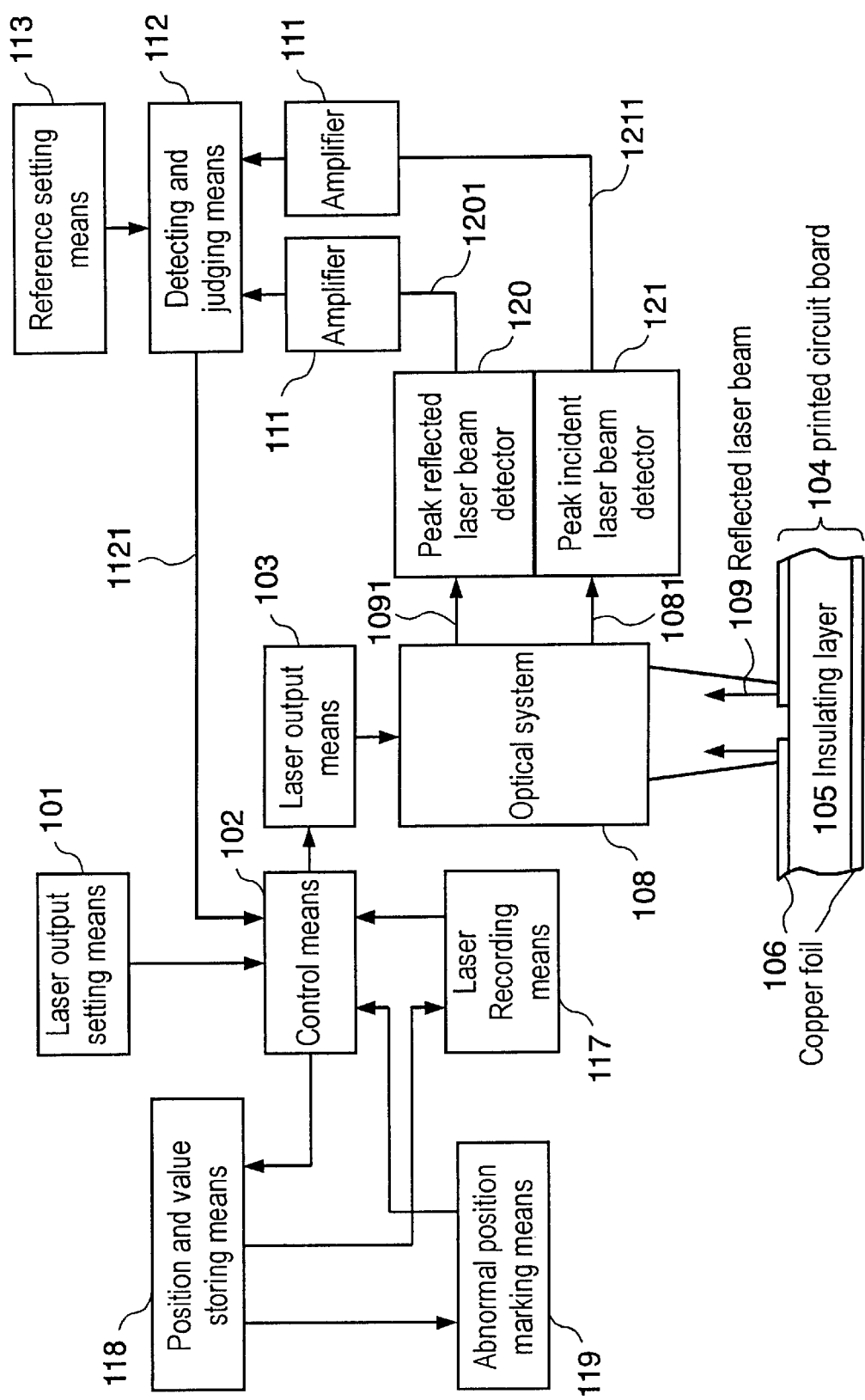
FIG. 20 is a schematic diagram of a laser processing apparatus showing a further different embodiment of the invention.

FIG. 20 is a schematic diagram of a laser processing apparatus showing a further different embodiment of the invention corresponding to the laser processing method of FIG. 8. The laser processing apparatus of FIG. 20 differs from FIG. 19 in that it further comprises means 120 and 121 for detecting the peak of reflected laser beam and the peak of incident laser beam, and in that the value of the peak of reflected laser beam divided by the peak of incident laser beam is used as the detected value.

The embodiment in FIG. 20 is the same as the embodiment in FIG. 19 in other parts, and in order to avoid duplicate explanation, herein, only the part different from FIG. 19, that is, the incident laser beam peak detecting means 121 is mainly explained.

In the hole inspection mode just before the hole processing, the reflected laser beam 109 from the copper foil 106 of the printed circuit board 104 advances in the optical path reverse to laser irradiation, and reaches the optical system 108. The optical system 108 separates the reflected laser beam 109 by its internal separating optical system. The separated component 1091 is guided into the peak detector 120. The peak detector 120 detects the peak value 1201 of the reflected component 1091, and then transmits a peak value 1201 to the amplifier 111.

On the other hand, the laser processing apparatus guides apart 1081 of incident laser beam from the laser branched in the optical system 108 into the incident peak detector 121. The incident peak detector 121 detects the incident laser beam peak value 1211, and transmits it to the amplifier 111. The amplifier 111 amplifies the signal, and then transmits it to detection judging means 112.

In order to eliminate output fluctuations of the laser, the detection judging means 112 divides the reflected peak value 1201 by the incident peak value 1211, and obtains the result as the detected value (detected value=reflected peak value/incident peak value), and judges if the detected value is within the desired reference based on the desired criterion 1131 preset in the inspection reference setting means 113. The reference setting means 113 sends the result 1121 of the judgement to the control means 102.

The subsequent structure and operation of the laser processing apparatus is the same as in the foregoing embodiment, and is not explained herein.

Thus, the embodiment is advantageous in that as the laser processing apparatus makes use of the ratio of the reflected peak value 1201 and incident peak value 1211 in the inspection mode, the operation is stable regardless of fluctuations of the output of laser beam, and further in that the speed and precision of inspection are improved.

Figure 21:
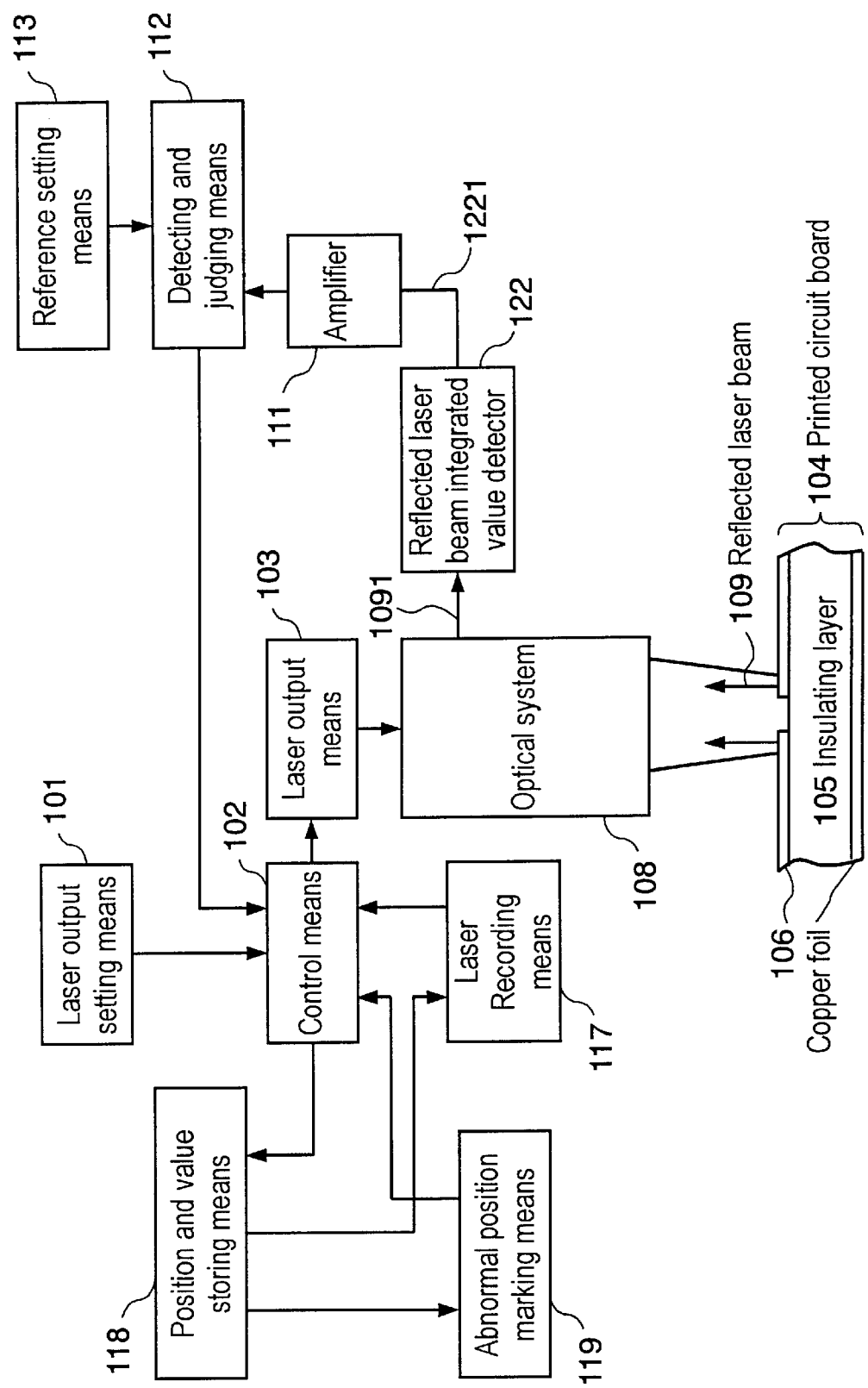
FIG. 21 is a schematic diagram of a laser processing apparatus showing a further different embodiment of the invention.

FIG. 21 is a schematic diagram of a laser processing apparatus showing a further different embodiment of the invention corresponding to the laser processing method of FIG. 9. The laser processing apparatus of FIG. 21 differs from FIG. 19 or FIG. 20 in that it further comprises means 122 for detecting the integral value of reflected light, and in that the integral value is used as the detected value.

The embodiment of FIG. 21 is the same as the embodiment of FIG. 19 or FIG. 20 in other parts In order to avoid duplicate explanation, herein, only the part different from FIG. 19 or FIG. 20, that is, the reflected laser beam integral value detecting means 122 is mainly explained.

In the hole inspection mode just before the hole processing, the reflected laser beam 109 from the copper foil 106 of the printed circuit board 104 advances in the optical path reverse to laser irradiation, and then reaches the optical system 108. The optical system 108 separates the reflected laser beam 109 by its internal separating optical system. The separated reflected component 1091 is guided into the reflected laser beam integral value detecting means 122. The reflected integral value detecting means 122 integrates the reflected component 1091 in order to eliminate fluctuations of laser output due to a noise component, and transmits the reflected integral detected value 1211 to the amplifier 111. The subsequent operation of the laser processing apparatus is the same as in the foregoing embodiment, and is not explained herein.

Thus, the embodiment is advantageous in that as the laser processing apparatus makes use of the reflected integral value 121 in inspection mode. Therefore, the operation is stable regardless of fluctuations of the output of laser beam due to a noise component.

Figure 22:
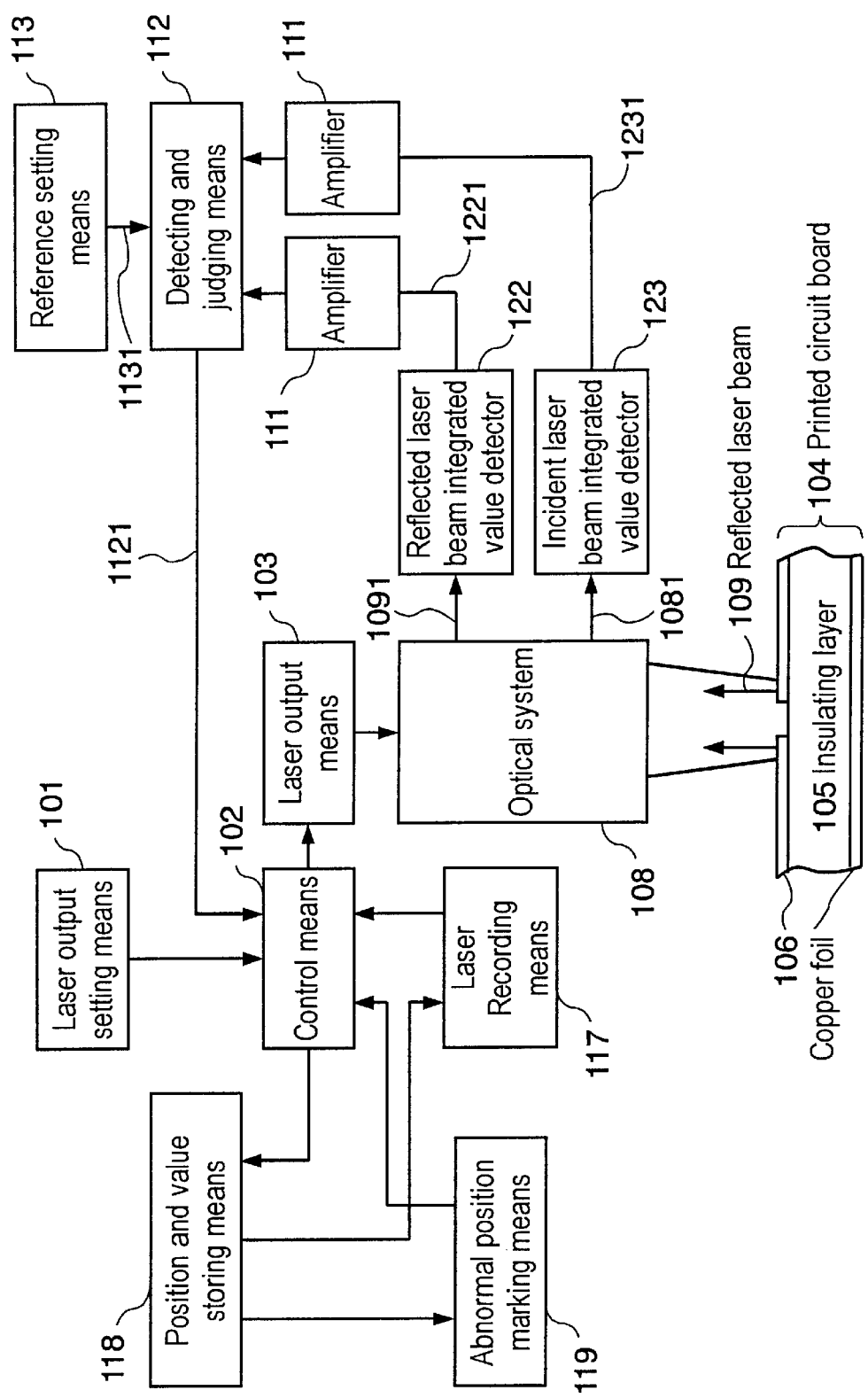
FIG. 22 is a schematic diagram of a laser processing apparatus showing a further different embodiment of the invention.

FIG. 22 is a schematic diagram of a laser processing apparatus showing a further different embodiment of the invention corresponding to the laser processing method of FIG. 10. The laser processing apparatus of FIG. 22 differs from FIG. 20 or FIG. 21 in that it further comprises means 122 and 123 for detecting the integral value of reflected laser beam and integral value of incident laser beam, and in that the value of dividing the integral value of reflected laser beam by the integral value of incident laser beam is used as the detected value.

The embodiment of FIG. 22 is the same as the embodiment of FIG. 21 in other parts. In order to avoid duplicate explanation, herein, only the part different from FIG. 21, that is, the incident laser beam integral value detecting means 123 is mainly explained.

In the hole inspection mode just before the hole processing, the reflected laser beam 109 from the copper foil 106 of the printed circuit board 104 advances in the optical path reverse to laser irradiation, and then reaches the optical system 108. The optical system 108 separates the reflected laser beam 109 by its internal separating optical system. The separated reflected component 1091 is guided into the reflected integral value detecting means 122. The reflected integral value detecting means 122 detects the integral value 1221 of the reflected component 1091, and then transmits the integral value 1221 of the reflected laser beam to the amplifier 111.

On the other hand, the laser processing apparatus guides the part 1081 of incident laser beam from the laser branched in the optical system 108 into the incident integral value detector 123. The incident integral value detector 123 detects the integral value 1231 of incident laser beam, and then transmits it to the amplifier 111. The amplifier 111 amplifies the signal, and then transmits it to detection judging means 112.

In order to eliminate output fluctuations of the laser, the detection judging means 112 divides the reflected integral value 1221 by the incident integral value 1231, so as to obtain the result as the detected value (detected value= reflected integral value/incident integral value), and to judge if the detected value is within the desired reference based on the desired criterion 1131 preset in the reference setting means 113. The reference setting means 113 sends the result 1121 of judgement to the control means 102.

The subsequent operation of the laser processing apparatus is the same as in the foregoing embodiment, and is not explained herein.

Thus, the embodiment is advantageous in that as the laser processing apparatus makes use of the ratio of the reflected integral value 1221 and incident integral value 1231 in the inspection mode. Therefore the operation is stable regardless of fluctuations of the output of laser beam due to noise component, and further in that the speed and precision of inspection are improved.

Figure 23:
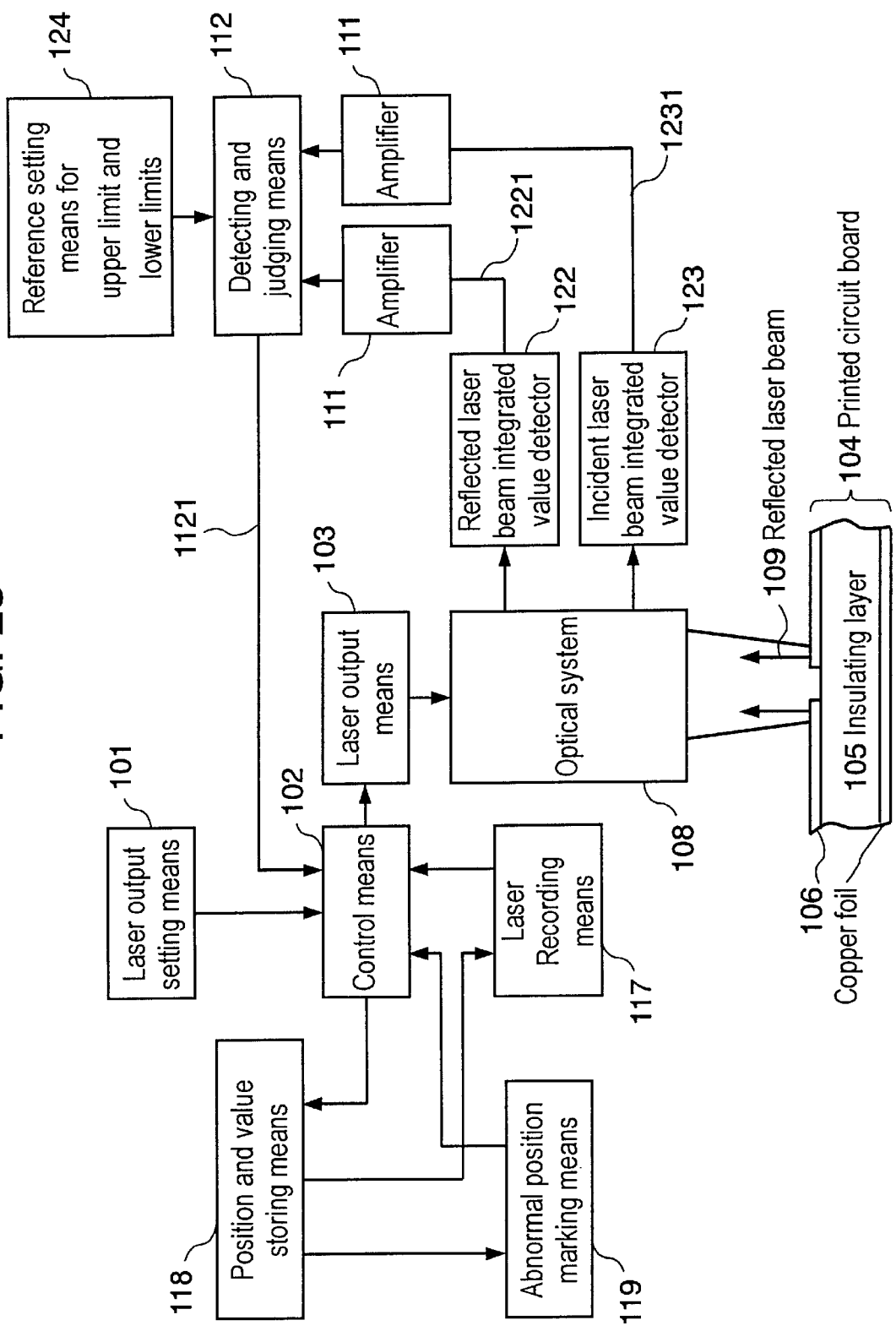
FIG. 23 is a schematic diagram of a laser processing apparatus showing a further different embodiment of the invention.

FIG. 23 is a schematic diagram of a laser processing apparatus showing a further different embodiment of the invention corresponding to the laser processing method of FIG. 11. The laser processing method of FIG. 23 differs from FIG. 22 in that it further comprises means 124 for determining the lower limit and upper limit of desired value, and in that it judges abnormality when the detected value is outside of the range of the lower limit and upper limit.

As the embodiment in FIG. 23 is the same as the embodiment of FIG. 22 in other parts, so in order to avoid duplicate explanation, herein, only the part different from FIG. 22, that is, the setting means 124 for setting the inspection reference is mainly explained.

The laser processing apparatus first sets in the inspection reference setting means 124, different from the case of FIG. 22, it sets the upper limit and lower limit of the desired criterion. The detection judging means 112, relating to the upper limit and lower limit of the desired criterion, divides the reflected integral value 1221 by the incident integral value 1231. The detection judging means 112 then compares the result of the detected value (detected value=reflected light integral value/incident light integral value) with the upper limit and lower limit. The detection judging means 112 judges if the detected value is within the lower limit and upper limit of the desired reference, and then sends the result of judgement to the control means 102. The subsequent operation of the laser processing apparatus is the same as in the foregoing embodiment, and is not explained herein.

Thus, the embodiment is advantageous in that the laser processing apparatus makes use of the ratio of the reflected integral value 1221 and incident integral value 1231 in inspection mode. Therefore, the operation is stable regardless of fluctuations of the output of laser beam due to the noise component, and further, the speed and precision of inspection are improved. In addition, it is further advantageous that since the upper limit and lower limit of the desired criterion are set in the detecting judging means 112 of the laser processing apparatus, the judging range of the detection judging means 112 is limited, and so the detection judging means 112 can quickly produce the result of the judgement.

According to the laser processing method or apparatus of the invention, since the reflected laser beam of the laser irradiation on the printed circuit board is detected first, abnormality in position, diameter or shape of the hole can be detected just before the hole making process. Therefore, it is advantageous, in the laser processing method or apparatus of the invention, that the printed circuit board can be processed without requiring any extra process for prior inspection. It is also advantageous, in the invention, that since the data about an abnormal hole is recorded and stored even after laser processing, the operator can easily and smoothly recognize the abnormal position and the abnormal mode at the time of re-inspection or re-processing. It is further advantageous that in correction at post-processing, the operator can save labor in interlayer connection by solder or conductive paste, and in final product inspection. As a result, it is advantageous that the cycle time of manufacturing a printed circuit board is improved, and the occurrence of wasteful expense or material loss can be minimized.

What is claimed is:

1. A laser processing method for inspecting and processing a printed circuit board for having electronic devices assembled thereon, the printed circuit board comprising at least a conductive first layer including a plurality of holes and an insulating second layer underneath the conductive first layer, said laser processing method comprising:

applying a laser beam to a portion of the conductive first layer including one of the plurality of holes therein and to a corresponding portion of the insulating second layer underneath;

optically detecting a reflected laser beam;

judging whether or not the intensity value or the amplitude value of the reflected laser beam as a detected value conforms to a desired value;

stopping laser processing of the portion of the insulating layer corresponding to the one of the plurality of holes in the conductive layer, if the detected value of the reflected laser beam differs from the desired value, wherein the one of the plurality of holes is deemed to be an abnormal hole; and processing the portion of the insulating layer corresponding to the one of the plurality of holes in the conductive layer when the detected value of the reflected laser beam conforms to the desired value.

2. The laser processing method of claim 1, further comprising:

recording a position of the abnormal hole; and repeating said applying operation, said detecting operation, said judging operation, said stopping operation, said processing operation, and said recording operation for the remainder of the plurality of holes in the conductive layer.

3. The laser processing method of claim 2, further comprising marking information about the position of the abnormal hole in a non-working area of the circuit board, wherein said repeating operation further comprises repeating said marking operation for the remainder of the plurality of holes in the conductive layer.

4. The laser processing method of claimed 3, further comprising additionally marking the information about the abnormal hole in a non-working area near the corresponding abnormal hole, wherein said repeating operation further comprises repeating said additional marking operation for the remainder of the plurality of holes in the conductive layer.

5. The laser processing method of claim 2, further comprising storing the position of the abnormal bole in secondary storage means, wherein said repeating operation further comprises repeating said storing operation for the remainder of the plurality of holes in the conductive layer.

6. The laser processing method of claim 5, further comprising marking information about the position of the abnormal hole in a non-working area of the circuit board, wherein said repeating operation further comprises repeating said marking operation for the remainder of the plurality of holes in the conductive layer.

7. The laser processing method of claim 1, further comprising:

recording the detected value of the abnormal hole; and repeating said applying operation, said detecting operation, said judging operation, said stopping operation, said processing operation, and said recording operation for the remainder of the plurality of holes in the conductive layer.

8. The laser processing method of claim 7, further comprising marking information about the detected value of the abnormal hole in a non-working area of the circuit board, wherein said repeating operation further comprises repeating said marking operation for the remainder of the plurality of holes in the conductive layer.

9. The laser processing method of claim 7, further comprising storing the detected value of the abnormal hole in secondary storage means, wherein said repeating operation further comprises repeating said storing operation for the remainder of the plurality of holes in the conductive layer.

10. The laser processing method of claim 9, further comprising marking information about the detected value of the abnormal hole in a non-working area of the circuit board, wherein said repeating operation further comprises repeating said marking operation for the remainder of the plurality of holes in the conductive layer.

11. The laser processing method of claim 1, wherein said detecting operation comprises detecting a peak value of the reflected laser beam, and using the peak value as the detected value.

12. The laser processing method of claim 1, wherein said detecting operation comprises detecting a peak value of the intensity value or the amplitude value of the reflected laser beam and a peak value of an intensity value or an amplitude value of an incident laser beam, and using a value calculated by dividing the peak value of the reflected laser beam by the peak value of the incident laser beam as the detected value.

13. The laser processing method of claim 1, wherein said detecting operation comprises detecting an integral value of the intensity value or the amplitude value of the reflected laser beam, and using the integral value as the detected value.

14. The laser processing method of claim 1, wherein said detecting operation comprises detecting an integral value of the intensity value or the amplitude value of the reflected laser beam and an integral value of an intensity value or an amplitude value of an incident laser beam, and using a value calculated by dividing the integral value of the laser beam by the integral value of the incident laser beam as the detected value.

15. The laser processing method of claim 1, further comprising:
   determining a lower limit and an upper limit of the desired value; and
   judging the one of the plurality of holes to be abnormal when the detected value is out of a range of the lower limit and the upper limit.

16. The laser processing method of claim 1, further comprising:
   moving relative positions of a video camera and a bench on which the circuit board is mounted,
   controlling said relative positions in response to an irradiation of the laser beam to process the circuit board;
   taking an image of the position of the circuit board with the video camera during the irradiation of the laser beam; and
   displaying the state of the position of the circuit board during the irradiation of the laser beam on the screen of the monitor display.

17. A laser processing apparatus for inspecting and processing a printed circuit board for having electronic devices assembled thereon, the printed circuit board comprising at least a conductive first layer including a plurality of holes and an insulating second layer underneath the conductive first layer, said laser processing apparatus comprising:
   means for applying a laser beam to a portion of the conductive first layer including one of the plurality of holes therein and to a corresponding portion of the insulating second layer underneath;
   means for optically detecting a reflected laser beam;
   means for judging whether or not the intensity value or the amplitude value of the reflected laser beam as a detected value conforms to a desired value;
   means for stopping laser processing of a portion of the insulating layer corresponding to the one of the plurality of holes in the conducting layer, if the detected value of the reflected laser beam differs from the desired value, wherein the one of the plurality of holes is deemed to be an abnormal hole; and
   means for processing the portion of the insulating layer corresponding to the one of the plurality of holes in the conductive layer deemed to be a normal hole when the detected value of the reflected laser beam conforms to the desired value.

18. The processing apparatus of claim 17, further comprising means for recording a position of the abnormal hole, wherein each of the plurality of holes is deemed to either be a normal hole or an abnormal hole.

19. The laser processing apparatus of claim 18, further comprising means for storing the position of the abnormal hole in secondary storage means.

20. The laser processing apparatus of claim 19, further comprising means for marking information about the position of the abnormal hole stored in the secondary storage means in a non-working area of the circuit board.

21. The laser processing apparatus of claim 18, further comprising means for marking information about the position of the abnormal hole in a non-working area of the circuit board.

22. The laser processing apparatus of claim 21,
   wherein said means for marking also marks the information about the abnormal hole in a non-working area near the corresponding abnormal hole.

23. The laser processing apparatus of claim 17, further comprising means for recording the detected value of the abnormal hole, wherein each of the plurality of holes is deemed to either be a normal hole or an abnormal hole.

24. The laser processing apparatus of claim 23, further comprising means for storing the detected value of the abnormal hole in secondary storage means.

25. The laser processing apparatus of claim 24, further comprising means for marking information about the detected value of the abnormal hole stored in the secondary storage means in a non-working area of the circuit board.

26. The laser processing apparatus of claim 23, further comprising means for marking information about the detected value of the abnormal hole in a non-working area of the circuit board.

27. The laser processing apparatus of claim 17,
   wherein said means for detecting the reflected laser beam comprises means for detecting a peak value of the intensity value or the amplitude value of the reflected laser beam, and means for using the peak value as the detected value.

28. The laser processing apparatus of claim 17,
   wherein said means for detecting the reflected laser beam comprises means for detecting a peak value of the intensity value or the amplitude value of the reflected laser beam and a peak value of an intensity value or an amplitude value of an incident laser beam, and means for using a value calculated by dividing the peak value of the reflected laser beam by the peak value of the incident laser beam as the detected value.

29. The laser processing apparatus of claim 17,
   wherein said means for detecting the reflected laser beam comprises means for detecting an integral value of the intensity value or the amplitude value of the reflected laser beam, and means for using the integral value as the detected value.

30. The laser processing apparatus of claim 17,
wherein said means for detecting the reflected laser beam comprises means for detecting an integral value of the intensity value or the amplitude value of the reflected laser beam and an integral value of an intensity value or an amplitude value of an incident laser beam, and means for using a value calculated by dividing the integral value of the reflected laser beam by the integral value of the incident laser beam as the detected value.

31. The laser processing apparatus of claim 17, further comprising:
means for determining a lower limit and an upper limit of the desired value, and
means for judging the one of the plurality of holes to be abnormal when the detected value is out of a range of the lower limit and the upper limit.

32. The laser processing apparatus of claim 17, further comprising:
a video camera;
a monitor display operable to display an image taken by said video camera,
a bench on which the circuit board is to be mounted;
means for moving relative positions of said video camera and said bench,
means for controlling the relative positions corresponding to an irradiation of the laser beam to process the circuit board; and
means for taking an image of a working position during the laser irradiation with said video camera, and displaying state of the working position on a screen of said monitor display.

* * * * *